US007264842B2

(12) United States Patent
Watanabe et al.

(10) Patent No.: US 7,264,842 B2
(45) Date of Patent: Sep. 4, 2007

(54) METHOD OF MANUFACTURING A WIRING SUBSTRATE FOR A DISPLAY PANEL

(75) Inventors: Yasuyuki Watanabe, Tokyo (JP); Kazuya Ishiwata, Kanagawa (JP); Shinsaku Kubo, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 375 days.

(21) Appl. No.: 10/886,632

(22) Filed: Jul. 9, 2004

(65) Prior Publication Data

US 2004/0259038 A1 Dec. 23, 2004

Related U.S. Application Data

(62) Division of application No. 10/227,386, filed on Aug. 26, 2002, now Pat. No. 6,787,984.

(30) Foreign Application Priority Data

Aug. 27, 2001 (JP) ............................. 2001-255466

(51) Int. Cl.
*B05D 5/12* (2006.01)
*B05D 3/02* (2006.01)
*B05D 7/00* (2006.01)

(52) U.S. Cl. ..................... 427/64; 427/256; 427/372.2; 427/402

(58) Field of Classification Search .................. 427/58, 427/256, 372.2, 402, 64
See application file for complete search history.

(56) References Cited

U.S. PATENT DOCUMENTS 5,659,329 A    8/1997  Yamanobe et al. ........... 345/74
6,137,218 A   10/2000  Kaneko et al. ............. 313/495
6,169,356 B1   1/2001  Ohnishi et al. ............ 313/495
6,179,678 B1   1/2001  Kishi et al. ................. 445/24
6,246,168 B1   6/2001  Kishi et al. ................ 313/495
6,283,813 B1 * 9/2001  Kaneko et al. ............... 445/24
6,296,896 B1  10/2001  Takahashi et al. ............ 427/77
6,426,588 B1   7/2002  Yanagisawa ................ 313/422
6,621,207 B2   9/2003  Uda et al. .................... 313/485
6,786,787 B2   9/2004  Yanagisawa ................. 445/24
7,121,913 B2  10/2006  Yanagisawa ................. 445/24

FOREIGN PATENT DOCUMENTS

| EP | 0 936 652 | 8/1999 |
|----|-----------|--------|
| JP | 6-342636  | 12/1994 |
| JP | 7-235255  | 9/1995 |
| JP | 7-326311  | 12/1995 |
| JP | 8-185818  | 7/1996 |
| JP | 9-50757   | 2/1997 |
| JP | 9-102271  | 4/1997 |
| JP | 2903295   | 3/1999 |

(Continued)

*Primary Examiner*—Brian K. Talbot
(74) *Attorney, Agent, or Firm*—Fitzpatrick, Cella, Harper & Scinto

(57) ABSTRACT

A manufacturing method for a wiring substrate for a display panel having a plurality of wiring electrodes thereon includes the step of forming wirings in an orthogonal projection area of an image forming member onto the wiring substrate by photolithography using a photo paste. In addition, wires are formed in an area where the frame member is disposed by pattern printing using paste ink for printing.

3 Claims, 16 Drawing Sheets

FOREIGN PATENT DOCUMENTS

| | | |
|---|---|---|
| JP | 2000-251665 | 9/2000 |
| JP | 2000-251778 | 9/2000 |
| JP | 2000-251802 | 9/2000 |
| JP | 2000-306501 | 11/2000 |
| JP | 2001-189136 | 7/2001 |
| WO | WO 01/29858 | 4/2001 |

* cited by examiner

SCHEMATIC DRAWING (a)
OF A–A' SECTIONAL VIEW

SCHEMATIC DRAWING (b)
OF A–A' SECTIONAL VIEW

CROSS SECTION SHAPES WHERE AVERAGE ANGLE TO SUBSTRATE IS LESS THAN 90 DEGREES

CROSS SECTION SHAPES WHERE
AVERAGE ANGLE TO SUBSTRATE
IS LARGER THAN 90 DEGREES

METHOD OF MANUFACTURING A WIRING SUBSTRATE FOR A DISPLAY PANEL

This is a divisional application of application Ser. No. 10/227,386, filed on Aug. 26, 2002, now issued as U.S. Pat. No. 6,787,984.

BACKGROUND OF THE INVENTION

1. Field of the Invention

The present invention relates to a substrate for a display panel where a drive signal is applied through a plurality of wiring electrodes drawn out from the inside to the outside of a container, and to an image forming apparatus such as a display device using the same.

2. Related Background Art

Conventionally, as display devices, the following are known: gas discharging type ones such as PDPs (plasma display panels); and electron beam irradiating type ones such as FEDs (field emission displays) where light emitting members are irradiated with electron beams. As electron-emitting devices for electron beam irradiating type displays, two kinds are known: thermionic source type ones; and cold cathode electron source type ones. The latter type includes field emission type devices (FE type devices), metal-insulator-metal devices (MIM devices), and surface conduction electron-emitting devices.

The above-mentioned surface conduction electron-emitting devices have an advantage that a number of devices can be formed over a large area since they are simple in structure and easily manufactured, and thus, various kinds of applications of the devices are under research to make full use of the advantage. The applications include those to an ion beam source, and to a display device such as an image forming apparatus. As an example, the present applicant proposed in Japanese Patent Application Laid-Open Nos. 2000-251778 and 2000-251802 an image forming apparatus in which an electron source plate where multiple electron-emitting devices are connected to wirings in a matrix and an opposing substrate having a phosphor disposed therein are laminated together to form a high vacuum container (display panel).

However, when the above-mentioned image forming apparatus is constructed in which an electron source plate where multiple electron-emitting devices are connected to wirings in a matrix and an opposing substrate having a phosphor disposed therein are laminated together to form a high vacuum container (display panel), and when the area of the image forming apparatus is made larger and the quality of the image forming apparatus is made higher, the following problems arise.

First of all, as a wiring material, thick film paste including metal and a glass material is used to satisfy required wiring resistance. However, when higher definition is tried to be achieved in order to make higher the quality of the image forming apparatus, it is necessary to make the wiring width sufficiently small in a display area. It is desirable for a high definition display device to have the wiring width of about 70 μm or less in order to be sufficient for general use, though, specifically, depending on the specific purpose of using the display device.

Further, as in the case of a surface conduction electron-emitting device disclosed in the above-mentioned Japanese Patent Application Laid-Open No. 2000-251778, when an electron source plate is used which is configured such that gaps between opposing electrode pairs (device electrodes) are disposed in parallel with column (Y) direction wirings (lower wirings) and such that electron-emitting regions are formed as lines substantially in parallel with the Y direction wirings (lower wirings), since the trajectory of emitted electrons must be controlled, it is desired that the edge height of the Y direction wirings is sufficiently high (for example, about 14 μm) in the display area. The sufficient height is also necessary in order to sufficiently decrease the resistance value of the wiring as described above.

As used herein, the term "display area" means an orthogonal projection area of an image forming member such as a phosphor onto a wiring substrate. When a display panel is formed by disposing the above-mentioned electron source plate and a transparent substrate, having a phosphor formed therein, so as to be opposed to each other, an area on the electron source plate (wiring substrate) opposed to the phosphor is the orthogonal projection area of the image forming member (phosphor) onto the wiring substrate.

As a result of consideration of specific means for materializing formation of wirings having a minimum wiring width and a sufficient height (thickness) in order to attain both higher definition and decreased resistance of matrix wirings in the display area, we found it was preferable for the wiring formation method to be changed from conventional screen printing to photolithography using a photo paste material. More specifically, when wirings are conventionally formed using printing, since the cross section shape is a smooth hemisphere, it is difficult to materialize both a sufficient height and a high definition wiring width. As a wiring shape materializing both a narrow width and a sufficient height (thickness), a rectangle having abrupt edges is preferable. We consider that, in order to form wirings in such a shape, photolithography using a photo paste material is preferable.

However, when the thickness of the photo paste material is increased to secure an edge height of the wirings for the purpose of decreasing the wiring resistance and controlling the trajectory of electrons emitted from the electron-emitting devices, the edges of a pattern are curled (scooped) and the plate is easily subject to cracks, and thus, a problem can arise in that the airtightness is decreased (a leak path is formed) at the outer periphery of the display area where the panel is seal-bonded.

SUMMARY OF THE INVENTION

A main object of the present invention is to improve the disadvantage and to obtain a higher quality image both by attaining higher luminance and higher definition of image display devices and image forming apparatus using a wiring substrate and by materializing an airtight container capable of maintaining a vacuum atmosphere or the like.

According to an aspect of the present invention, there is provided a wiring substrate for a display panel comprising a plurality of wiring electrodes thereon, with an airtight container being formed by disposing an opposing substrate through a frame member on the surface of the substrate having the wiring electrodes, and the airtight container having an image forming member therein, in which an average angle between a cross section of the wirings and the wiring substrate in an orthogonal projection area of the image forming member onto the wiring substrate is obtuse, while an average angle between a cross section of the wirings and the wiring substrate in an area where the frame member is disposed is acute.

Also, the present invention is especially effective in the case where the thickness of the wirings is 8 μm or more.

Also, the present invention is especially effective in the case where atmosphere in the airtight container is depressurized atmosphere.

Also, according to the present invention, it is preferable that the width of the wirings in the orthogonal projection area of the image forming member onto the wiring substrate is narrower than the width of the wirings in the area where the frame member is disposed.

Also, according to the present invention, there is provided a manufacturing method for a wiring substrate for a display panel having a plurality of wiring electrodes thereon, with an airtight container being formed by disposing an opposing substrate through a frame member on the surface of the substrate having the wiring electrodes, and the airtight container having an image forming member therein, comprising: forming wirings in an orthogonal projection area of the image forming member onto the wiring substrate by photolithography using a photo paste; and forming wirings in an area where the frame member is disposed by pattern printing using paste ink for printing.

Also, according to still another aspect of the present invention, there is provided a manufacturing method for a wiring substrate for a display panel having a plurality of wiring electrodes thereon, with an airtight container being formed by disposing an opposing substrate through a frame member on the surface of the substrate having the wiring electrodes, and the airtight container having an image forming member therein, comprising: forming a wiring pattern in an orthogonal projection area of the image forming member onto the wiring substrate and in an area where the frame member is disposed by photolithography using a photo paste; forming an overcoat layer which disappears at a point higher than a temperature at which an organic component of the photo paste disappears and lower than a softening point of an inorganic component of the photo paste on the wiring pattern in the area where the frame member is disposed; and baking simultaneously the wiring pattern and the overcoat layer.

Also, according to still another aspect of the present invention, there is provided a manufacturing method for a wiring substrate for a display panel having a plurality of wiring electrodes thereon, with an airtight container being formed by disposing an opposing substrate through a frame member on the surface of the substrate having the wiring electrodes, and the airtight container having an image forming member therein, comprising: forming first wirings in an orthogonal projection area of the image forming member onto the wiring substrate and in an area where the frame member is disposed by photolithography using a photo paste; and forming second wirings on the first wirings in the area where the frame member is disposed by pattern printing using paste ink for printing.

Also, according to the present invention, there is provided an image display device using a wiring substrate according to any one of the above-mentioned aspects of the invention.

According to the present invention, when a desired wiring height is secured to decrease the wiring resistance and a structure of the present invention is used as wirings for supplying signals to electron-emitting devices in the display area, the trajectory of emitted electrons can be satisfactorily controlled. In a seal-bonding portion outside the display area, a wiring substrate free from wiring edge curls and side cracks can be materialized.

Further, by using such a wiring substrate, an image forming apparatus such as an image display device having improved light emission efficiency and having airtightness and reliability which are high enough to maintain a vacuum or the like can be materialized.

DESCRIPTION OF THE PREFERRED EMBODIMENTS

Embodiments of the present invention are now described in detail in the following. Before the description, the relationship between a wiring shape in a seal bonding portion and airtightness is described in detail with reference to the drawings.

Figure 16:
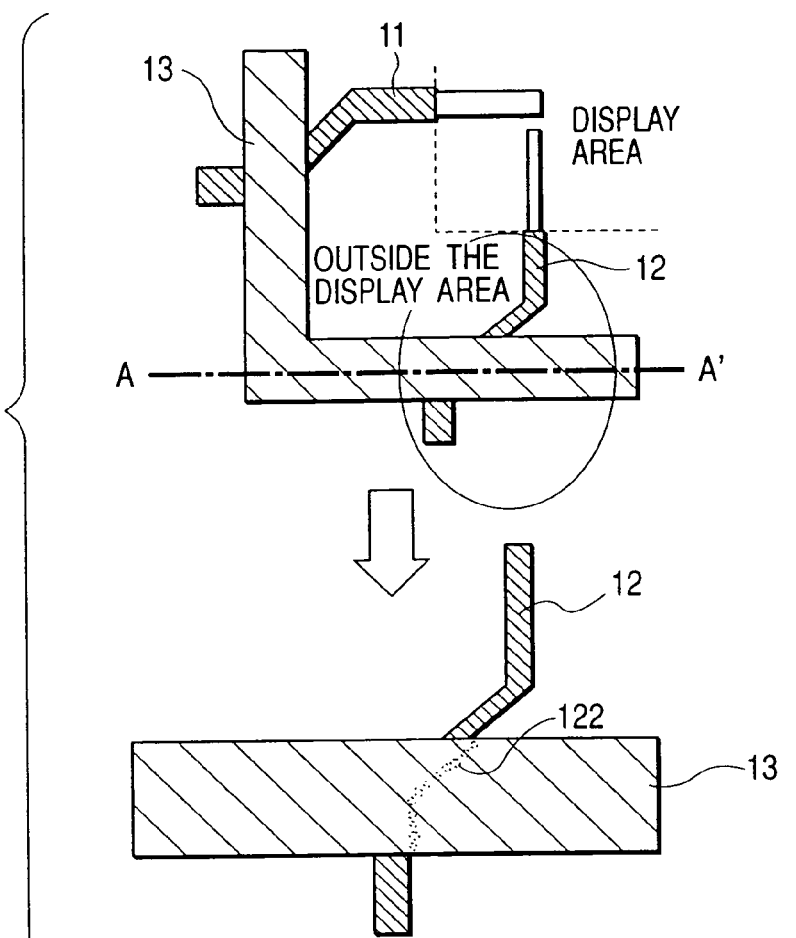
FIG. 16 is a schematic view illustrating formation of leak paths and a cause thereof.
Figure 16:
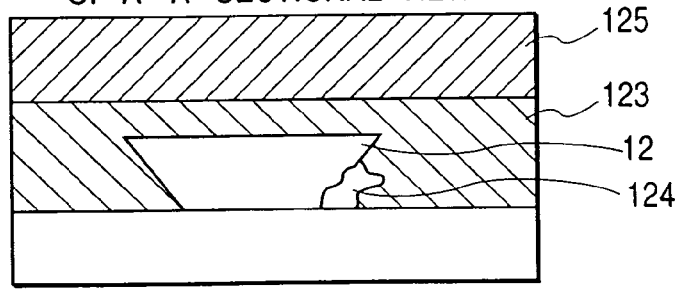
Figure 16:
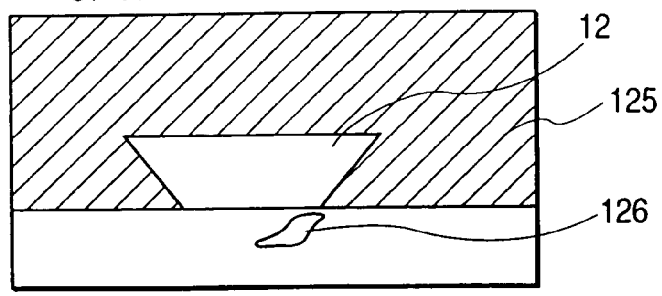

FIG. 16 is a partial enlarged view of a so-called matrix wiring substrate where X direction wirings and Y direction wirings are intersecting each other with an insulating layer disposed therebetween. Wirings are drawn out from an image display area to edge portions of the substrate. There is an edge curl in the wiring shape of a seal bonding portion as a part of the drawn out portion. In the figure, leak paths 125 and 126 are schematically illustrated which are formed along the wirings due to a scoop in the pattern edge of a Y direction drawn out wiring 12 and a crack formed in the substrate (called a "side cracks").

A study by the inventor of the present invention has revealed that such a crack in the substrate could be suppressed by formation of an insulating layer. Therefore, for the purpose of preventing such a crack, for example, formation of an insulating layer in a panel seal bonding portion simultaneous with the formation of the insulating layer in the intersecting portions of the matrix wiring portion is considered. Since the insulating layer pattern also has the effect of easing unevenness due to the wiring pattern, this is also effective in the case of vacuum formation through an O ring made of resin as a vacuum container forming member 13.

However, if there is a scoop in the pattern edge, a leak path called a mousehole 124 is formed between the pattern edge and the insulating layer. The leak path, together with a leak path due to a crack in the substrate, decreases the vacuum airtightness.

On the other hand, with regard to a mousehole due to a scoop in the pattern edge, a leak path can be eliminated by using frit glass as the vacuum container forming member 13. However, even if frit glass is used, vacuum leak due to a crack in the substrate can not be accommodated. Further, when an O ring made of resin is used as the vacuum container forming member 13, a leak path can be eliminated only when the angle formed between a wiring cross section and a substrate in a seal bonding portion is at least an acute angle.

Further, consideration by the inventor of the present invention has revealed that formation of edge curls of the wirings and cracks in the substrate depends not only on the film thickness but also on the pattern width. More specifically, when the height (thickness) of the wirings amounts to some extent, if the width of the wirings becomes larger, the substrate is more subject to cracks and edge curls. Therefore, by making the wiring width narrower, formation of edge curls and cracks in the substrate can be prevented to some extent.

However, as described in the above, actually, the wiring width of the drawn out wiring and the mounting terminal portion is required to be larger than that in the display area considering the wiring resistance. Therefore, rectangular wirings, which materialize both decrease in the wiring resistance and higher definition of the wiring pattern, still have a problem in order to materialize an airtight container, and further improvement is necessary to satisfy all of decreasing the wiring resistance, materializing a higher definition pattern, and forming an airtight container.

As a result of comprehensive consideration of various conditions required of a wiring substrate for a display panel, the inventor has invented the present invention wherein the wiring shape is rectangular in the display area while the wiring shape is rounded in the seal bonding portion. In other words, by making obtuse the average angle between the cross section of the wiring and the substrate in the display area and making acute the average angle between the cross section of the wiring and the substrate in the seal bonding portion where a frame member is disposed, the above-mentioned decreasing the wiring resistance, materializing a higher definition, and forming an airtight container are made possible. It is to be noted that, here, that the average angle between the cross section of the wirings and the substrate is obtuse means the relationship between the wirings having cross section shapes illustrated in FIGS. 18A to 18C and the substrate surface, while that the average angle between the cross section of the wirings and the substrate is acute means the relationship between the wirings having cross section shapes illustrated in FIGS. 17A to 17C and the substrate surface.

Further, here, for the purpose of describing the present invention in further detail, the relationship between the cross section shapes of the wirings in the seal bonding portion, and cracks in the substrate and leak paths is described.

Figure 17A:
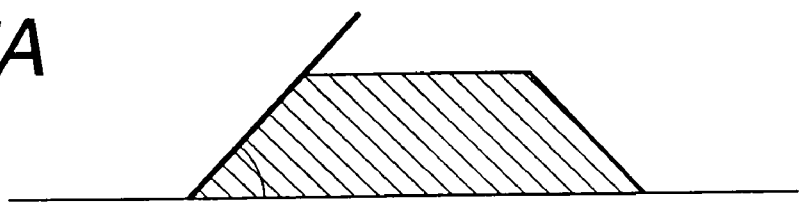
FIGS. 17A, 17B, and 17C are schematic views for describing average angle between cross section shapes of wirings and a substrate.
Figure 17B:
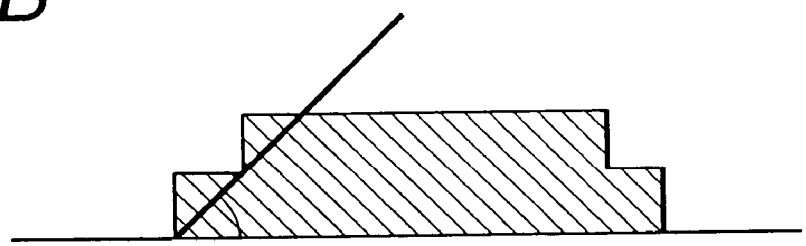
Figure 17C:
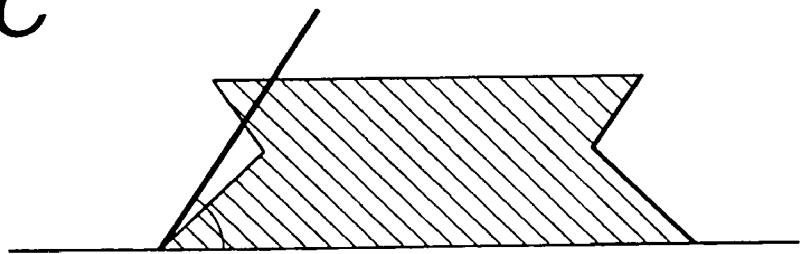
Figure 18A:
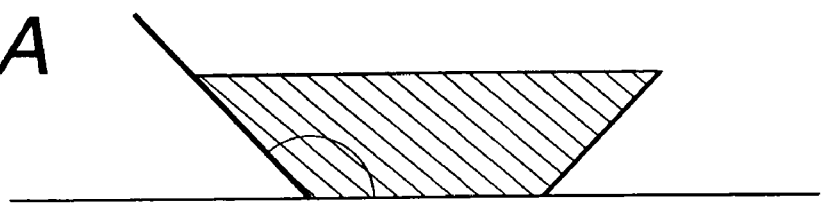
FIGS. 18A, 18B, and 18C are schematic views for describing average angle between cross section shapes of wirings and a substrate.
Figure 18B:
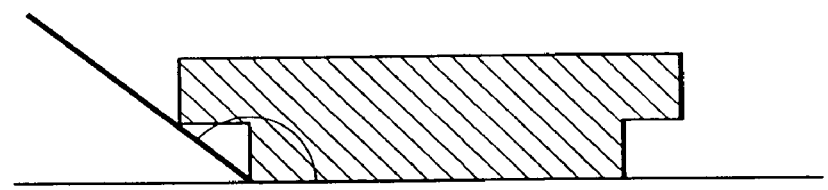
Figure 18C:
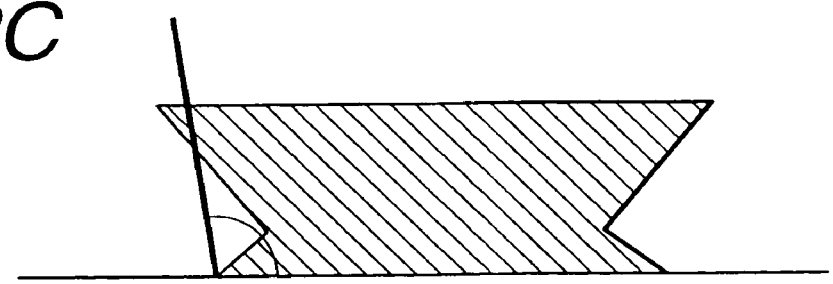

FIGS. 17A to 17C and FIGS. 18A to 18C schematically illustrate average angles between cross sections of the wirings and the substrate. When the average angle is acute as illustrated in FIGS. 17A to 17C, cracks in the substrate are less likely to be formed, while, when the average angle is obtuse as illustrated in FIGS. 18A to 18C, cracks in the substrate are more likely to be formed. Further, the acute average angles goes in the opposite direction to edge curls, and thus, are also effective in materializing vacuum airtightness.

Further, among methods of forming wirings available today in view of pattern stability, resistance value, and process conditions under which the resistance value is obtained, the average angle of the pattern edge can be made obtuse more easily in a photolithography process, while the average angle of the pattern edge can be made acute more easily in a screen printing process. Further, it has been found that, using the combination, by forming wirings in a photolithography process with the average angle of the pattern edge being obtuse but not too large, and then, on the wirings, forming wiring in a screen printing process with the average angle of the pattern edge being acute, thick film wirings having a substantially acute average angle of the pattern edge can be obtained.

The present invention has been made based on the above findings, and the configuration thereof is now specifically described in detail in the following. It is to be noted that, in the following description, the cross section shape of the wiring is different in an image display area (an area of orthogonal projection of an image forming member onto the substrate surface where wirings are formed) and outside the image display area including the seal bonding portion, but this is because such an embodiment is particularly preferred in view of manufacturing and the like. The present invention is not limited thereto, and it is sufficient that the cross section shape of the wiring is as required both in the image display area and in the seal bonding portion. Embodiments of the present invention are now described in the following.

The present applicant has made numerous proposals with regard to electron-emitting devices and their application. As a part of them, the following are example applications with regard to an image forming apparatus using surface conduction electron-emitting devices and the like.

Japanese Patent Application Laid-Open Nos. 9-102271 and 2000-251665 describe in detail device formation using an inkjet method. Japanese Patent Application Laid-Open Nos. 64-031332 and 7-326311 describe in detail arrangement of such devices in an XY matrix. Further, Japanese Patent Application Laid-Open Nos. 8-185818 and 9-50757 describe in detail a method of forming wirings, while Japanese Patent Application Laid-Open No. 6-342636 and the like describe in detail a driving method.

Still further, detailed description is found in, for example, Japanese Patent Application Laid-Open No. 7-235255 and Japanese Patent No. 2903295.

A surface conduction electron-emitting device disclosed in the above references is briefly described in the following.

Figure 15A:
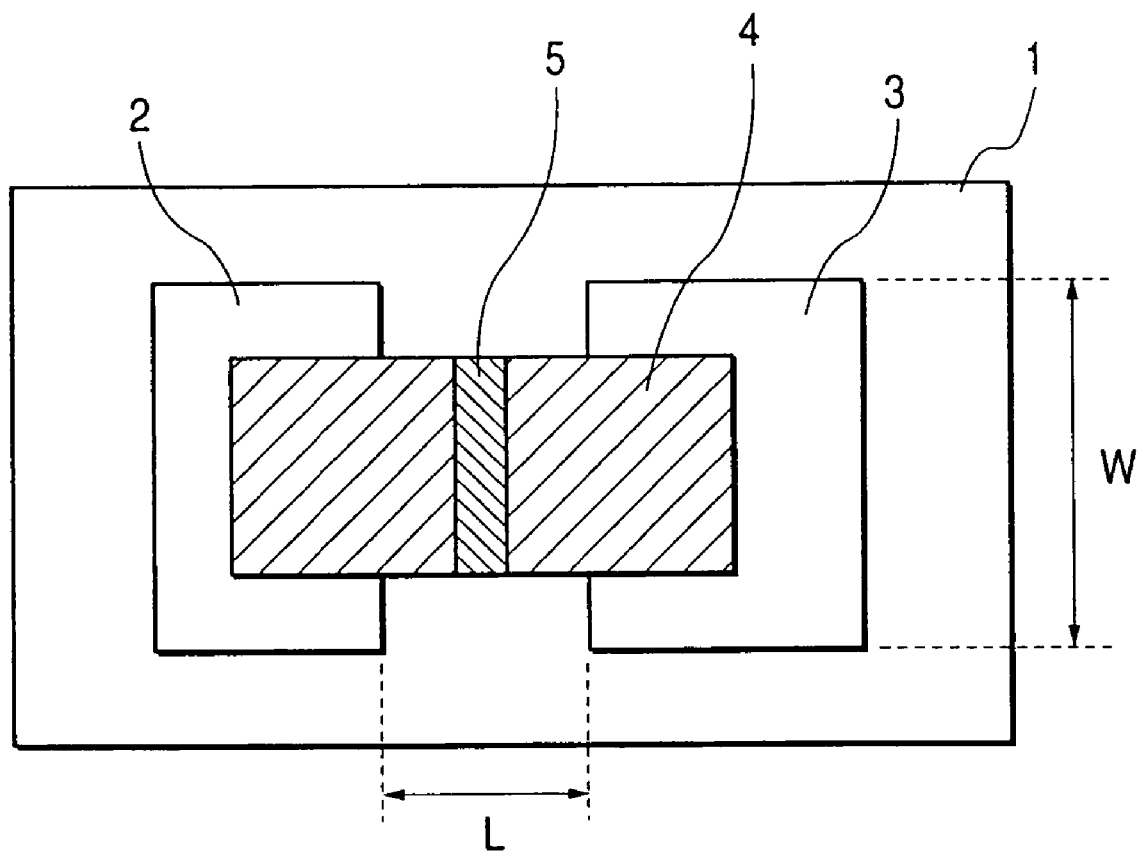
FIGS. 15A and 15B are schematic views illustrating a structural example of a surface conduction electron-emitting device.
Figure 15B:
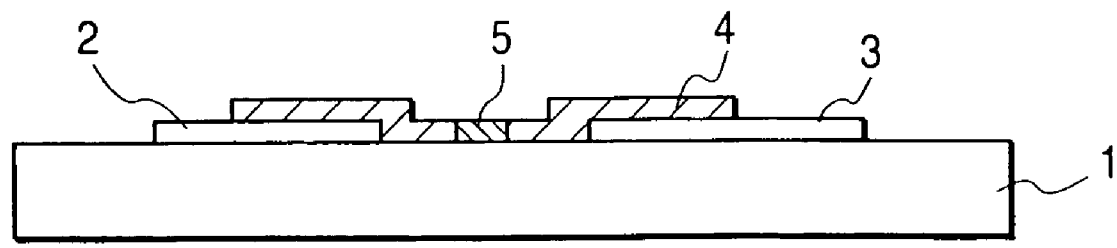

As schematically illustrated in FIGS. 15A and 15B, the above-mentioned surface conduction electron-emitting device comprises a substrate 1, a pair of opposing device electrodes 2 and 3 on the substrate 1, and a conductive film 4 connected to the device electrodes and having an electron-emitting region 5 as a part thereof.

The electron-emitting region 5 includes a portion where a part of the conductive film 4 is broken, deformed, or altered and a gap is formed. By carrying out a process called activation, deposition of the main component, which is carbon and/or a carbon compound, is formed in the gap and on the conductive film proximate to the gap. It is to be noted that the deposition is shaped to be opposed with a gap narrower than that formed in the conductive film 4.

Figure 2:
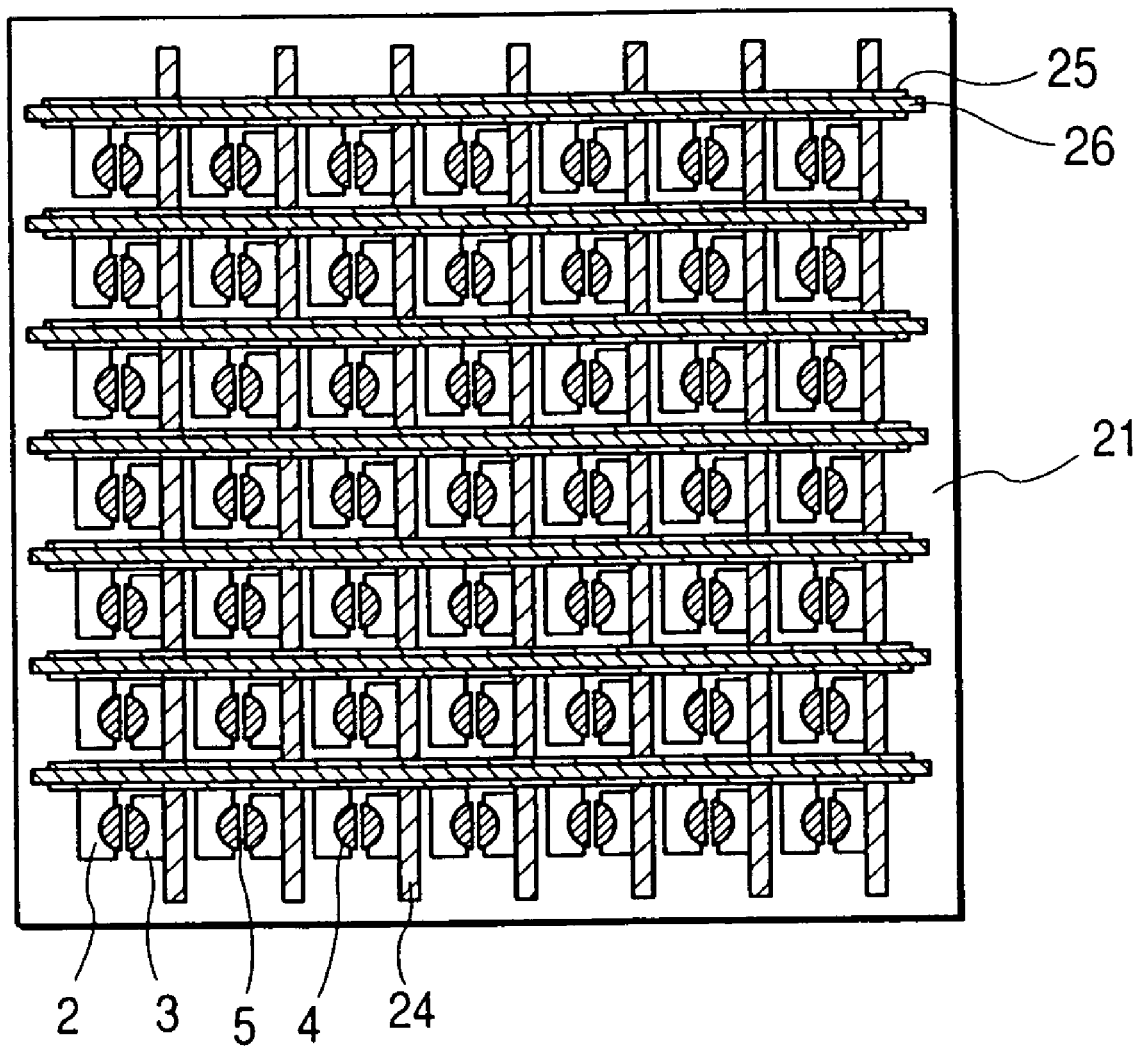
FIG. 2 is a plan view illustrating a basic structure in a display area of the electron source plate.

FIG. 2 illustrates a configuration of an electron source plate where multiple surface conduction electron-emitting devices are connected by wirings in a matrix. In FIG. 2, 21 denotes a substrate, 2 and 3 denote device electrodes, 4 denotes a conductive film (device film), 5 denotes an electron-emitting region, 24 denotes Y direction wirings (lower wirings), 25 denotes an insulating layer, and 26 denotes X direction wirings (upper wirings).

In the electron source plate, the plurality of Y direction wirings (lower wirings) 24, and then, the plurality of X direction wirings (upper wirings) 26 are formed on top of the substrate 21 with the insulating layer 25 disposed therebetween. An electron-emitting device including an electrode pair (device electrodes 2 and 3) is disposed proximate to each intersecting portion of the X and Y direction wirings. One electrode of the electrode pair (device electrode 3) is connected to one of the Y direction wirings 24 while the other electrode of the electrode pair (device electrode 2) is connected to one of the X direction wirings 26 through a contact hole provided in the insulating layer 25.

An example of a method of manufacturing the electron source plate is now briefly described with reference to FIGS. 3 to 6.

Figure 3:
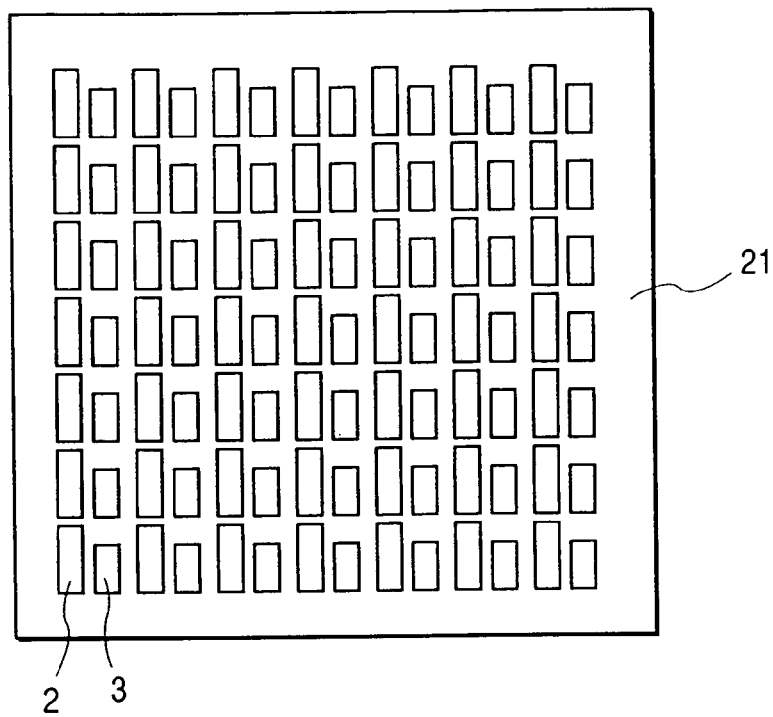
FIG. 3 is a view for describing a manufacturing process of the electron source plate of FIG. 2.

First, a plurality of electrode pairs (device electrodes 2 and 3) are formed on the substrate 21 (See FIG. 3).

Figure 4:
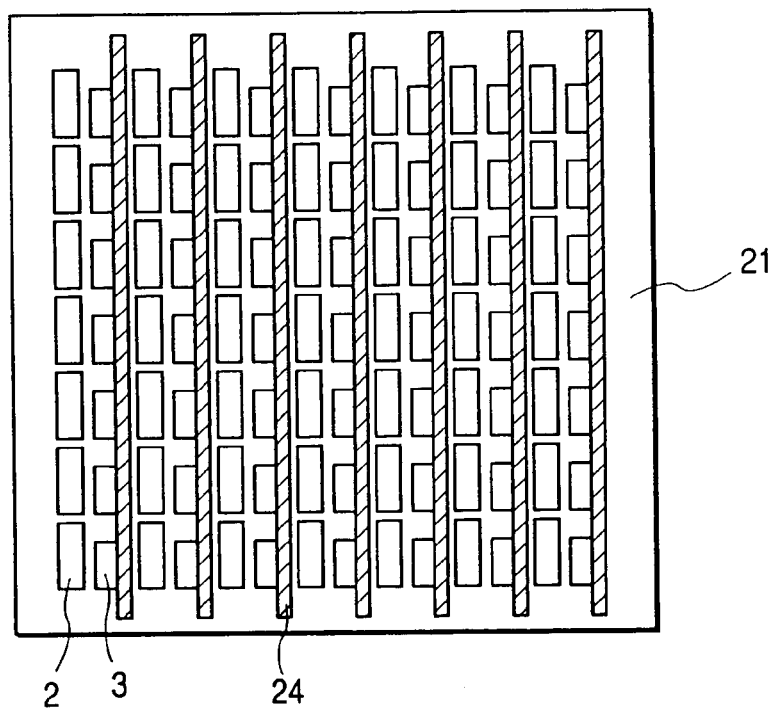
FIG. 4 is a view for describing the manufacturing process of the electron source plate of FIG. 2.

Then, the plurality of Y direction wirings (lower wirings) 24 are formed so as to be in contact with and so as to connect ones of the device electrodes (device electrodes 3) in a pattern as lines (See FIG. 4). Though not shown in the figure, the end portions of the Y direction wirings (lower wirings) 24 are used as drawn out wirings to an external drive circuit, and thus, have a larger wiring width. The Y direction wirings (lower wirings) 24 act as signal electrodes after they are formed in a panel as an image forming apparatus using the electron source plate.

Figure 5:
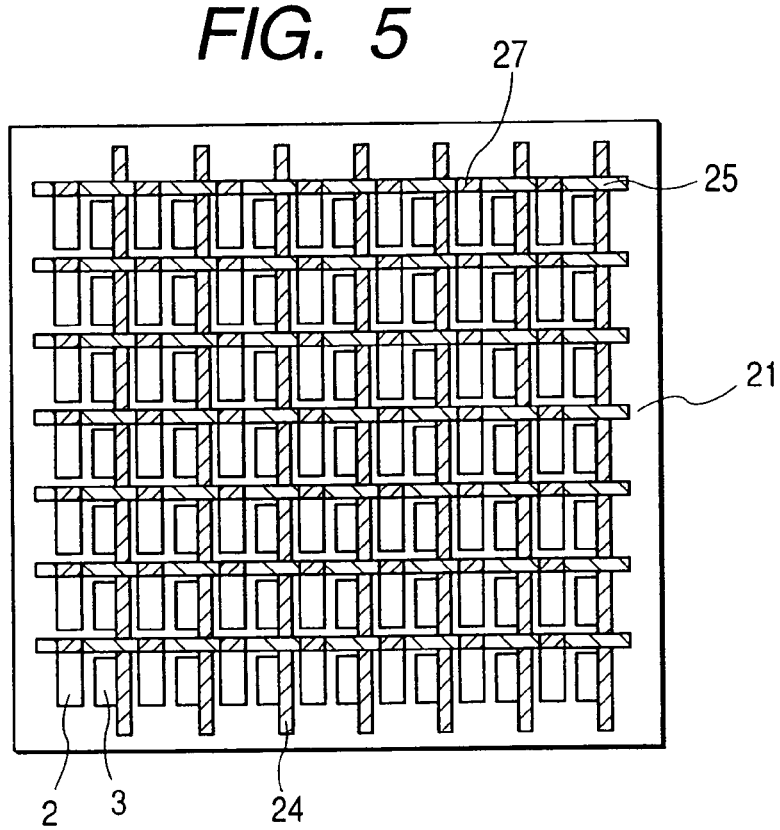
FIG. 5 is a view for describing the manufacturing process of the electron source plate of FIG. 2.

Then, for the purpose of insulating the upper and lower wirings from each other, the insulating layer 25 is formed (See FIG. 5). The insulating layer 25 is formed beneath the X direction wirings (upper wirings) to be described later so as to cover the intersecting portions with the previously formed Y direction wirings (lower wirings) 24 and so as to allow electrical connection between the X direction wirings (upper wirings) and the other ones of the device electrodes (device electrodes 2) with contact holes 27 provided at connecting portions corresponding to the respective devices.

Figure 6:
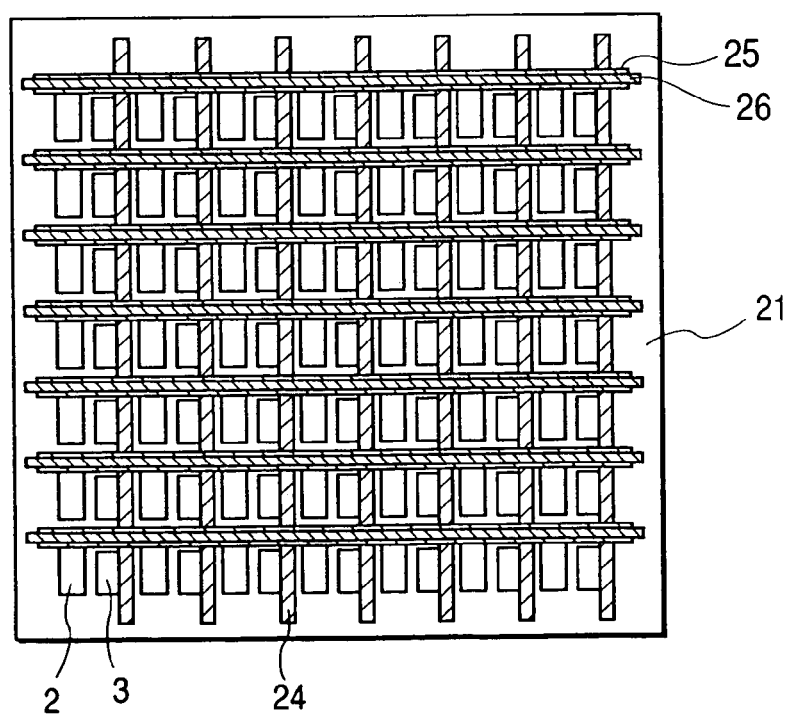
FIG. 6 is a view for describing the manufacturing process of the electron source plate of FIG. 2.

Then, the X direction wirings (upper wirings) 26 are formed on the previously formed insulating layer 25 (See FIG. 6). The X direction wirings 26 intersect the Y direction wirings 24 with the insulating layer 25 sandwiched therebetween, and are connected to the device electrodes 2 at the contact holes 27 provided in the insulating layer 25. Though not shown in the figure, the drawn out wirings to the external drive circuit are formed in a similar manner. The X direction wirings 26 act as scanning electrodes after they are formed in a panel as an image forming apparatus. Since the X direction wirings 26 are required to have lower wiring resistance than that of the Y direction wirings 24 acting as signal electrodes, the X direction wirings 26 are designed to have a larger wiring width or a larger film thickness.

Next, the conductive film 4 is formed between the device electrodes 2 and 3 using an inkjet method described in Japanese Patent Application Laid-Open Nos. 9-102271 and 2000-251665, for example (See FIGS. 2 and 7A to 7C).

Figure 8A:
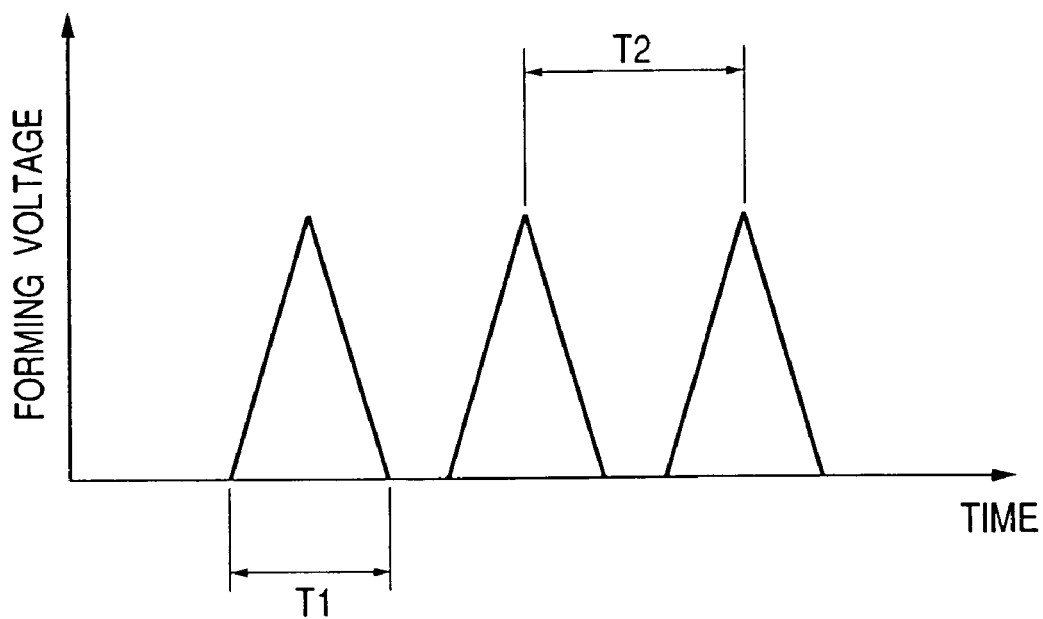
FIGS. 8A and 8B illustrate examples of forming voltage.
Figure 8B:
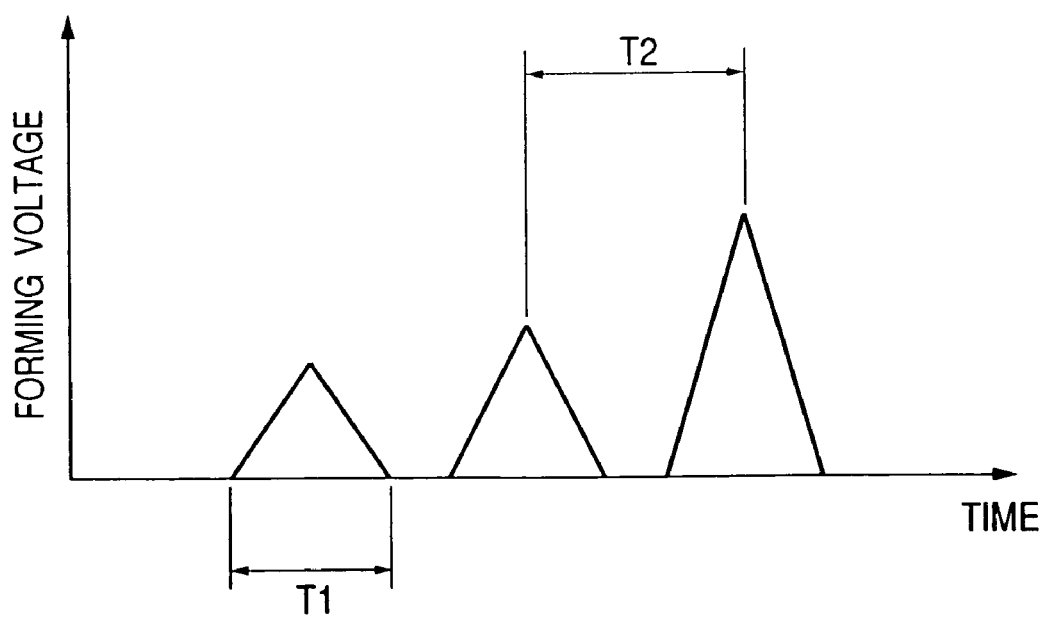

Then, by applying pulse voltage between the X and Y direction wirings 24 and 26 to pass electric current between the device electrodes 2 and 3, the conductive film 4 is locally broken, deformed, or altered to form an electron-emitting region (gap) which has electrically high resistance (a forming process). Examples of pulse voltage waveforms used here are illustrated in FIGS. 8A and 8B. Here, as illustrated in FIGS. 2, 15A, and 15B, the electron-emitting region (gap) 5 is formed in the gap between opposed device electrodes 2 and 3 being approximately in parallel with the gap.

Figure 11A:
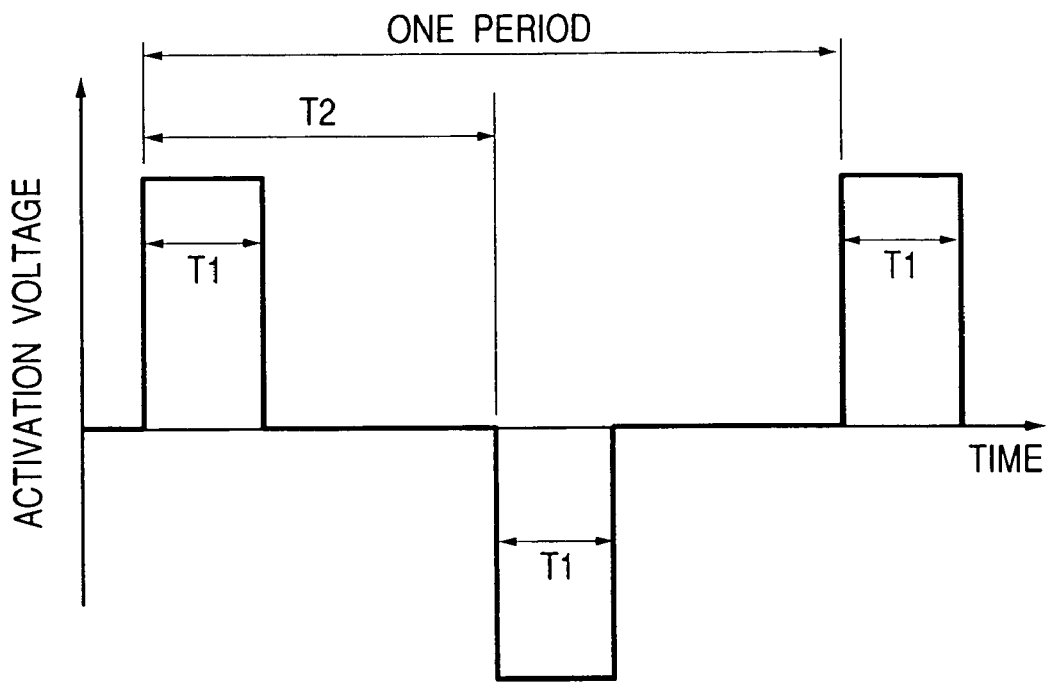
FIGS. 11A and 11B illustrate examples of activation voltage.
Figure 11B:
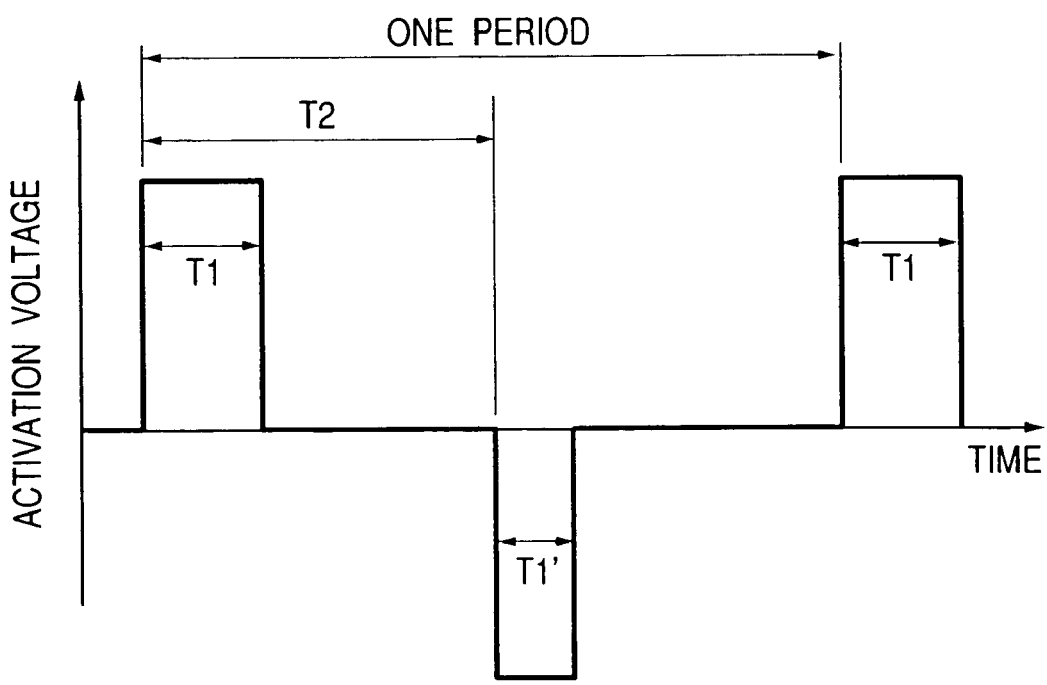

Next, in an atmosphere of a gas including carbon atoms, similarly to the above forming process, by applying pulse voltage between the X and Y direction wirings 24 and 26 to pass electric current between the device electrodes 2 and 3, carbon or a carbon compound is deposited as a carbon film proximate to the gap (an activation process). Examples of voltage waveforms used in the activation are illustrated in FIGS. 11A and 11B.

By the above processes, the electron source plate having thereon multiple surface conduction electron-emitting devices connected by matrix wirings is formed.

Next, basic characteristics of an electron-emitting device having the above-described device configuration and formed by the above-described manufacturing method are described with reference to FIGS. 9 and 10.

Figure 9:
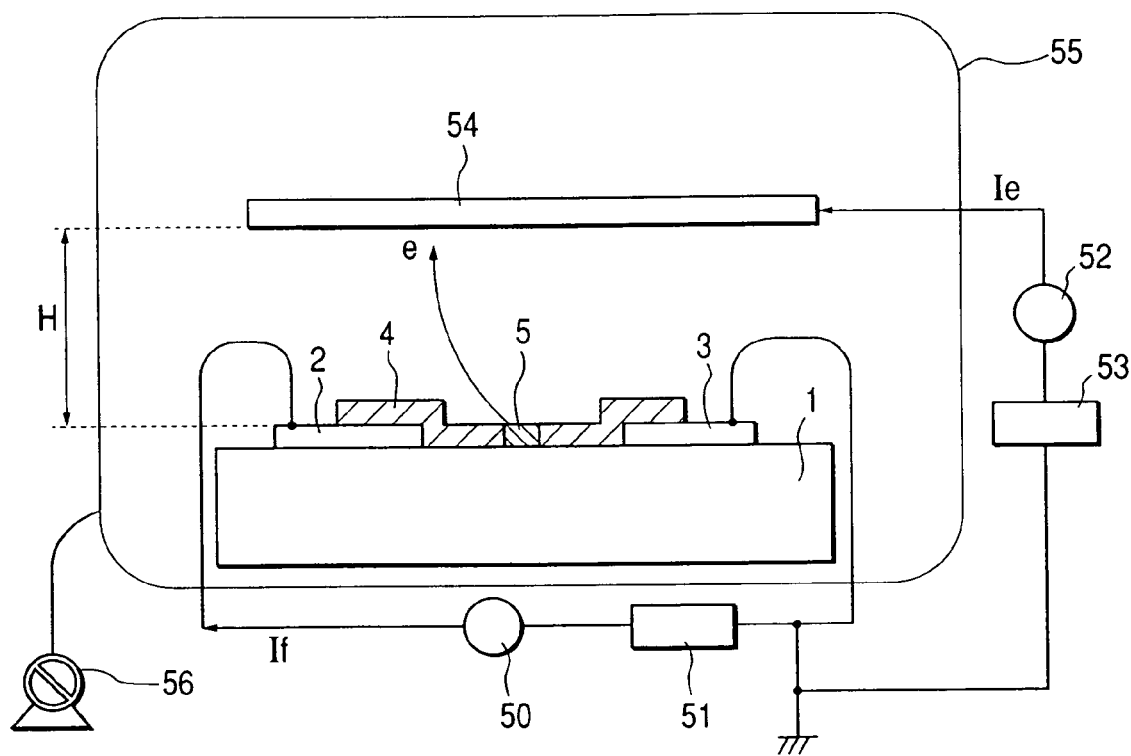
FIG. 9 is a schematic view of an apparatus for measuring characteristics of an electron-emitting device according to the present invention.

FIG. 9 is a schematic view of a measuring and evaluating apparatus for measuring electron emission characteristics of the electron-emitting device having the above-described device configuration. In FIG. 9, 51 denotes a power supply for applying device voltage Vf to the device, 50 denotes an ammeter for measuring device current If through an electrode portion of the device, 54 denotes an anode electrode for capturing emission current Ie emitted from the electron-emitting region of the device, 53 denotes a high voltage power supply for applying voltage to the anode electrode 54, and 52 is an ammeter for measuring emission current Ie emitted from the electron-emitting region of the device.

In measuring the device current If between the device electrodes 2 and 3 of the electron-emitting device and measuring the emission current Ie to the anode, the power supply 51 and the ammeter 50 are connected to the device electrodes 2 and 3, and the anode electrode 54 connected to the power supply 53 and the ammeter 52 is disposed above the electron-emitting device.

The electron-emitting device and the anode electrode 54 are provided in a vacuum system 55. The vacuum system 55 is provided with equipment necessary for a vacuum system such as a vacuum pump 56 and a vacuum gauge so as to be able to measure and evaluate the device in a desired vacuum. It is to be noted that the measurement was carried out with the voltage to the anode electrode 54 being in the range of 1 kV to 10 kV and the distance H between the anode electrode 54 and the electron-emitting device being in the range of 2 mm to 8 mm.

Figure 10:
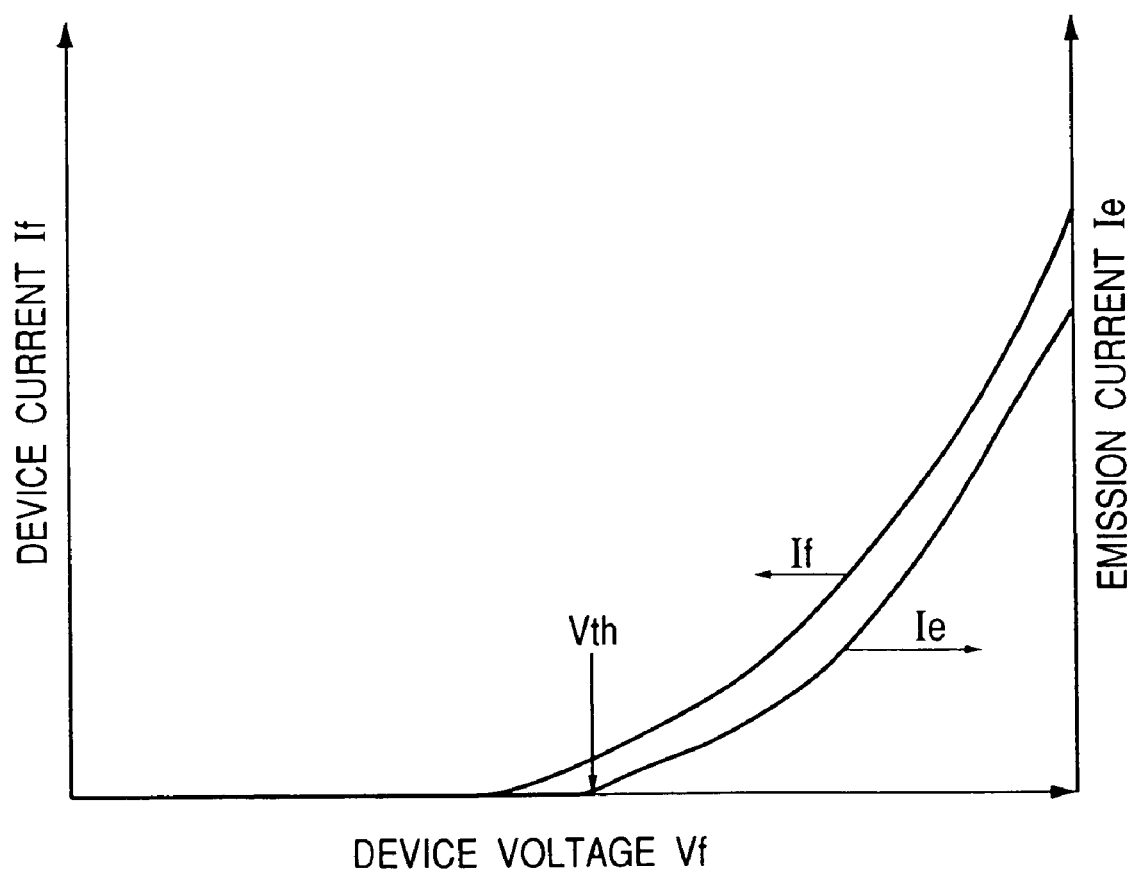
FIG. 10 illustrates the relationship between device current and emission current, and device voltage of a surface conduction electron-emitting device according to the present invention.

A typical example of the relationship between the emission current Ie and the device current If, and the device voltage Vf measured by the measuring and evaluating apparatus illustrated in FIG. 9 is shown in FIG. 10. It is to be noted that, though the magnitude of the emission current Ie is considerably different from the magnitude of the device current If, in FIG. 10, for the purpose of qualitatively comparing and considering the changes in If and Ie, the y axis for the emission current Ie and the y axis for the device current If are scaled differently and appropriately.

The present electron-emitting device has three characteristics with respect to the emission current Ie.

First, as is clear from FIG. 10, when device voltage higher than a certain voltage (Vth in FIG. 10 and referred to as a threshold voltage) is applied to the present device, the emission current Ie is rapidly increased, while scarcely any emission current Ie is detected when the device voltage is lower than the threshold voltage Vth. More specifically, it can be seen that the device presents characteristics of a nonlinear device having the clear threshold voltage Vth with respect to the emission current Ie.

Secondly, since the emission current Ie depends on the device voltage Vf, the emission current Ie can be controlled by the device voltage Vf.

Thirdly, the emission charge captured by the anode electrode 54 depends on the time period during which the device voltage Vf is applied. More specifically, the amount of charge captured by the anode electrode 54 can be controlled by the time period during which the device voltage Vf is applied.

Next, the electron source plate and the image forming apparatus according to the present invention are described.

As a basic configuration of an electron source plate according to the present invention, there is one as illustrated in FIG. 2.

In the electron source plate according to the present invention, the plurality of Y direction wirings (lower wirings) 24 and the plurality of X direction wirings (upper wirings) 26 are formed on the substrate 21. The plurality of X direction wirings (upper wirings) 26 are formed above the column direction wirings 24 with the insulating layer 25 disposed therebetween. The electron-emitting devices including the electrode pairs (device electrodes 2 and 3) are disposed proximate to the intersecting portions of the X and Y direction wirings. In particular, as illustrated in FIG. 2, the gaps between the opposing device electrodes 2 and 3 are disposed substantially in parallel with the Y direction wirings (lower wirings).

The characteristics of the electron source plate according to an embodiment of the present invention are described with reference to FIG. 1. When a display panel is configured by disposing it so as to oppose a transparent substrate having a light emitting material formed therein, in the display area where the wirings oppose an area having the light emitting material formed therein, at least the Y direction wirings 24 have a cross section shape the average angle of which with the substrate is obtuse such as illustrated in FIGS. 18A to 18C. Outside the display area, both of the X and Y direction wirings, that is, X direction drawn out wirings 11 and Y direction drawn out wirings 12 have a cross section shape the average angle of which with the substrate is acute such as illustrated in FIGS. 17A to 17C.

It is to be noted that, as used herein, the term "average angles" means the angle between a straight line obtained by compositing the outside shape lines of the cross section shape of the wiring (composite line) and the substrate surface. When the wiring is shaped such that the wiring width becomes narrower as the wiring goes away from the substrate, the composite line forms an acute angle with the substrate surface. When the wiring is shaped such that the wiring width becomes larger as the wiring goes away from the substrate, the composite line forms an obtuse angle with the substrate surface. It is to be added that, when the average angle between the wiring and the substrate is acute, the direction of stress acting on the edge of the wiring at a portion in contact with the substrate also forms an acute angle with the substrate surface, and, when the average angle between the wiring and the substrate is obtuse, the direction of stress acting on the edge of the wiring at a portion in contact with the substrate also forms an obtuse angle with the substrate surface.

Specific methods of forming the wirings having the above-mentioned cross section shapes are described in detail in the following embodiments, and the following methods are suitable:

(1) In the display area, at least the Y direction wirings 24 are formed by photolithography using a photo paste, while, outside the display area, both of the X and Y direction drawn out wirings 11 and 12 are formed by printing a pattern with screen printing; or (2) At least the pattern of the Y direction wirings 24 are formed in the display area and the pattern of both of the X and Y direction drawn out wirings 11 and 12 are formed outside the display area by photolithography using a photo paste, and after that, at least outside the display area, baking is carried out together with an overcoat layer which disappears at a point higher than a temperature at which any organic component in the photo paste disappears and lower than the softening point of any inorganic component in the photo paste.

It is to be noted that, as the above-mentioned overcoat layer, photosensitive resin such as photosensitive acrylic resin may be used.

As described in the above, by controlling the cross section shapes of the respective wirings in the display area and outside the display area, an electron source plate can be obtained in which a desired height of the Y direction wirings is secured to satisfactorily control the trajectory of emitted electrons in the display area, while both of the X and Y direction wirings are free from edge curls and side cracks outside the display area.

Next, an example of an image forming apparatus according to the present invention using the above-described electron source plate in a passive matrix is described with reference to FIG. 12.

Figure 12:
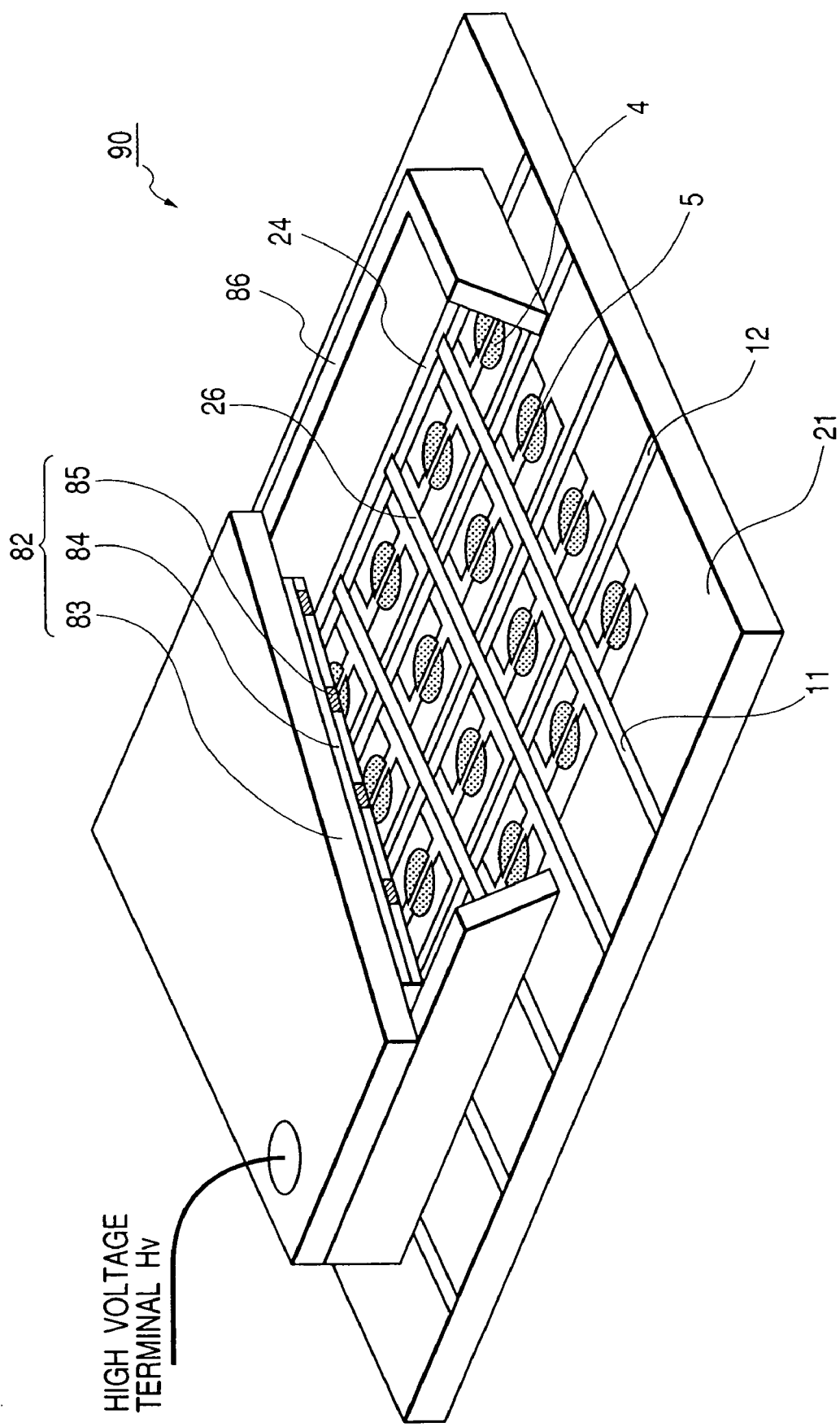
FIG. 12 is a perspective view schematically illustrating a structural example of an image forming apparatus according to the present invention.

In FIG. 12, 21 denotes the above-described electron source plate, 82 denotes a face plate comprising a glass substrate 83 and a fluorescent screen 84, a metal back 85, and the like formed on the inner surface of the glass substrate 83, and 86 denotes a support frame. The electron source plate 21, the support frame 86, and the face plate 82 are laminated via frit glass, and baking is carried out at 400 to 500° C. for more than ten minutes to perform seal bonding, thereby forming an envelope 90.

It is to be noted that the envelope 90 with sufficient strength against atmospheric pressure can be formed even in the case of a large area panel, by providing between the face plate 82 and the electron source plate 21 supports called spacers which are not shown in the figure.

Figure 13A:
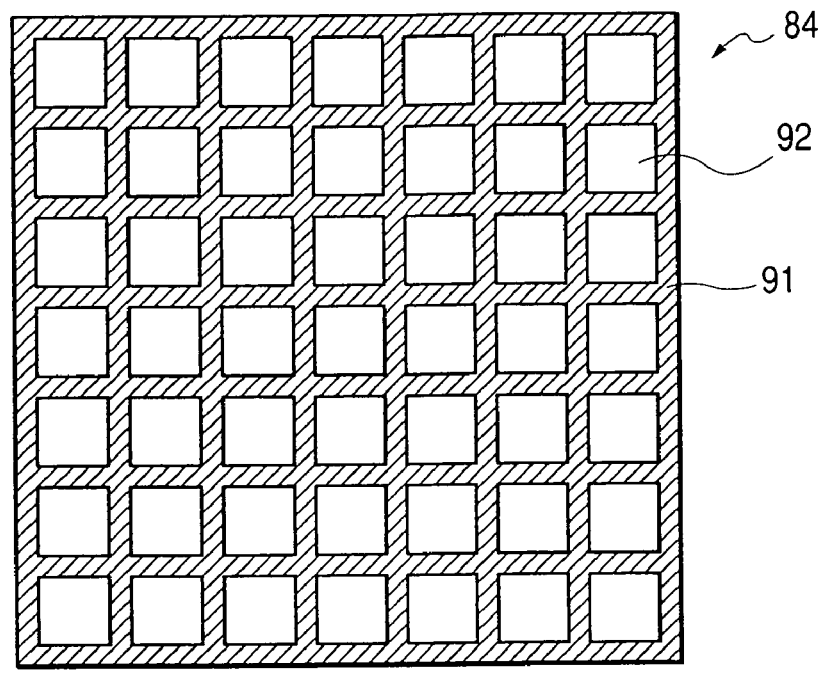
FIGS. 13A and 13B are schematic views showing examples of a fluorescent film of the image forming apparatus according to the present invention.
Figure 13B:
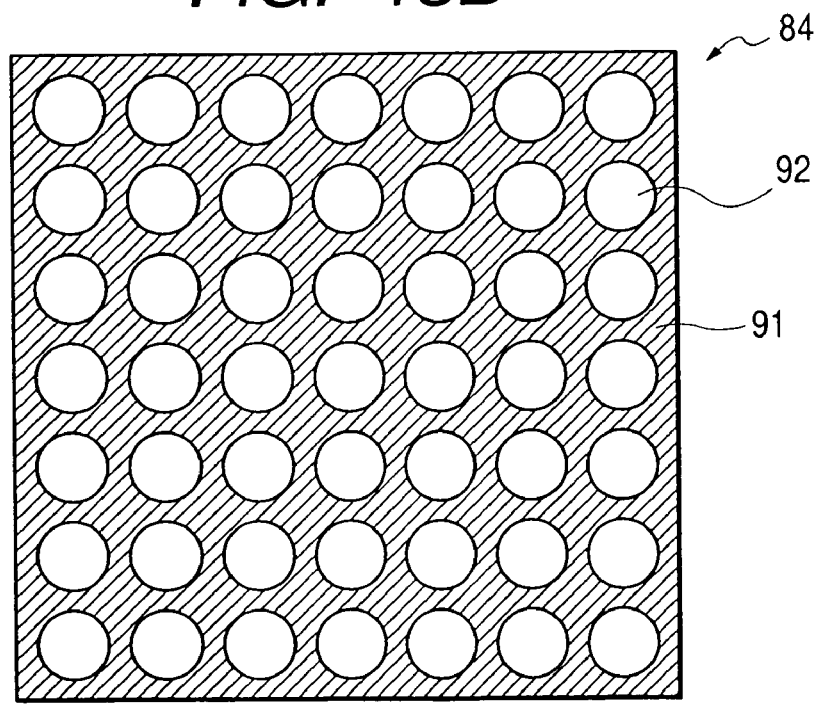

FIGS. 13A and 13B are views for describing the fluorescent screen 84 provided on the face plate 82. In the case of a monochrome fluorescent screen, the fluorescent screen 84 is made only of a phosphor, while, in the case of a color fluorescent screen, the fluorescent screen 84 comprises a black conductor 91 which is called "black stripes" or "a black matrix" depending on the arrangement of a phosphor, and the phosphor 92. The purpose of providing the black stripes or the black matrix is to make an inconspicuous color mixture and the like by blacking portions where the color of the phosphor 92 changes in a three-primary color phosphor necessary for color display, and to suppress contrast lowering due to external light reflected by the fluorescent screen 94.

The inner surface side of the fluorescent screen 84 is normally provided with the metal back 85. The purpose of the metal back is to improve the intensity by specularly reflecting toward the face plate 82 side a part of light emitted by the phosphor that is directed to the inner surface side, to make the metal back act as an anode electrode for applying electron beam acceleration voltage, and the like. The metal back can be formed by, after the fluorescent screen is formed, carrying out smoothing of the inner side surface of the fluorescent screen (generally called filming), and then, depositing Al by vacuum evaporation or the like.

When the above-mentioned seal bonding is carried out, in the case of a color fluorescent screen, since various colors of the phosphor have to correspond to the electron-emitting devices, sufficient positioning must be carried out by burning the upper and the lower substrates or the like.

In the seal bonding, the degree of vacuum of about $10^{-5}$ Pa is required. In addition, in order to maintain the degree of vacuum after the envelope 90 is encapsulated, gettering may be carried out. This is a process of forming an evaporation film by heating a getter disposed at a predetermined position (not shown) in the envelope using a heating method such as resistance heating or high-frequency heating just before or after the envelope 90 is encapsulated. The main component of the getter is normally Ba or the like. The degree of vacuum is maintained by the adsorptive activity of the evaporation film.

At this time, in the electron source plate according to the present invention, since both of the X and Y direction drawn out wirings outside the display area can be free from edge curls and side cracks, generation leak paths as illustrated in FIG. 16 can be prevented, and an image forming apparatus with high vacuum reliability can be materialized.

Embodiments of the present invention are now described in the following, though the present invention is not limited thereto.

EMBODIMENT 1

The present embodiment is an example where an electron source plate is formed by connecting multiple surface conduction electron-emitting devices to wirings in a matrix as illustrated in FIG. 2. In FIG. 2, reference numeral 21 denotes a substrate, 2 and 3 denote device electrodes, 4 denotes a conductive film (device film), 5 denotes an electron-emitting region, 24 denotes Y direction wirings (lower wirings), 25 denotes an insulating layer, and 26 denotes X direction wirings (upper wirings).

It is to be noted that FIG. 2 only illustrates the inside of the display area of the electron source plate. In an electron source plate actually manufactured, as illustrated in FIG. 1, the Y direction wirings 24 formed in the display area are connected to the Y direction drawn out wirings 12 outside the display area, and similarly, the X direction wirings 26 are connected to the X direction drawn out wirings 11. The X direction wirings 26 act as scanning electrodes after they are formed in a panel. Since the X direction wirings 26 are required to have lower wiring resistance than that of the Y direction wirings 24 acting as signal electrodes, the X direction wirings 26 are designed to have a larger wiring width or a larger film thickness.

A method of manufacturing the electron source plate of the present embodiment will now be described in the following with reference to FIG. 2 to FIGS. 7A to 7C.

(Formation of Device Electrode)

As the substrate 21, PD-200 glass (manufactured by Asahi Glass Company Ltd.) having only a small amount of alkali component at the thickness of 2.8 mm is used, with an $SiO_2$ film applied and baked thereto at the thickness of 100 nm as a sodium blocking layer.

On the glass substrate 21, first titanium (Ti) (at the thickness of 5 nm) and then ruthenium (Ru) (at the thickness of 40 nm) are formed by sputtering as an undercoat layer. Then, photoresist is applied and patterned by a series of photolithography processes, i.e., exposure, development, and etching, to form the device electrodes 2 and 3 (See FIG. 3). It is to be noted that, in the present embodiment, the distance L between the device electrodes=10 μm and the opposing length W=100 μm.

(Formation of Y Direction Wiring)

The material for the X direction wirings 26 and the Y direction wirings 24 as common wirings are required to have low resistance so that substantially equal voltage is applied to the multiple surface conduction electron-emitting devices, and the material, the film thickness, the wiring width, and the like are set as appropriate.

The Y direction wirings (lower wirings) 24 as signal wirings are formed by photolithography using a photo paste material so as to be in contact with and so as to connect the device electrodes 3 of the device electrodes 2 and in a pattern as lines. Ag photo paste ink DC-206 (manufactured by Dupont) is used as the material. After screen printing and drying the material, exposure and development are carried out in a predetermined pattern. After that, baking is carried out at the temperature of about 480° C. to form the Y direction wirings 24 (See FIG. 4). The Y direction wirings 24 have the thickness of about 15 μm and the wiring width of about 50 μm, respectively.

(Formation of Insulating Layer)

In order to insulate the upper and lower wirings from each other, the insulating layer 25 is formed. The insulating layer 25 is formed beneath the X direction wirings (upper wirings) to be described later so as to cover the intersecting portions with the previously formed Y direction wirings (lower wirings) 24 and so as to allow electrical connection between the X direction wirings (upper wirings) and the device electrodes 2 with contact holes 27 provided at connecting portions corresponding to the respective devices (See FIG. 5).

More specifically, after photosensitive glass paste J1345 (manufactured by Dupont) the main component of which is PbO is applied by screen printing, exposure and development are carried out. This is repeated four times, and finally, baking at the temperature of about 480° C. is carried out. The insulating layer 25 has the thickness of about 30 μm as a whole and the width of 150 μm.

(Formation of X Direction Wiring)

After the Ag paste ink is applied on the previously formed insulating layer 25 by screen printing, it is dried. The same is repeated to carry out double application. After that, baking at the temperature of about 420° C. is carried out to form the X direction wirings (upper wirings) 26 (See FIG. 6). The X direction wirings 26 intersect the Y direction wirings 24 with the insulating layer 25 sandwiched therebetween, and are connected to the device electrodes 22 at the contact holes 27 provided in the insulating layer 25.

The X direction wirings 26 act as scanning electrodes after they are formed in a panel. It is to be noted that the X direction wirings 26 have the thickness of about 15 μm and the wiring width of about 300 μm.

(Formation of Drawn out Wiring)

Figure 1:
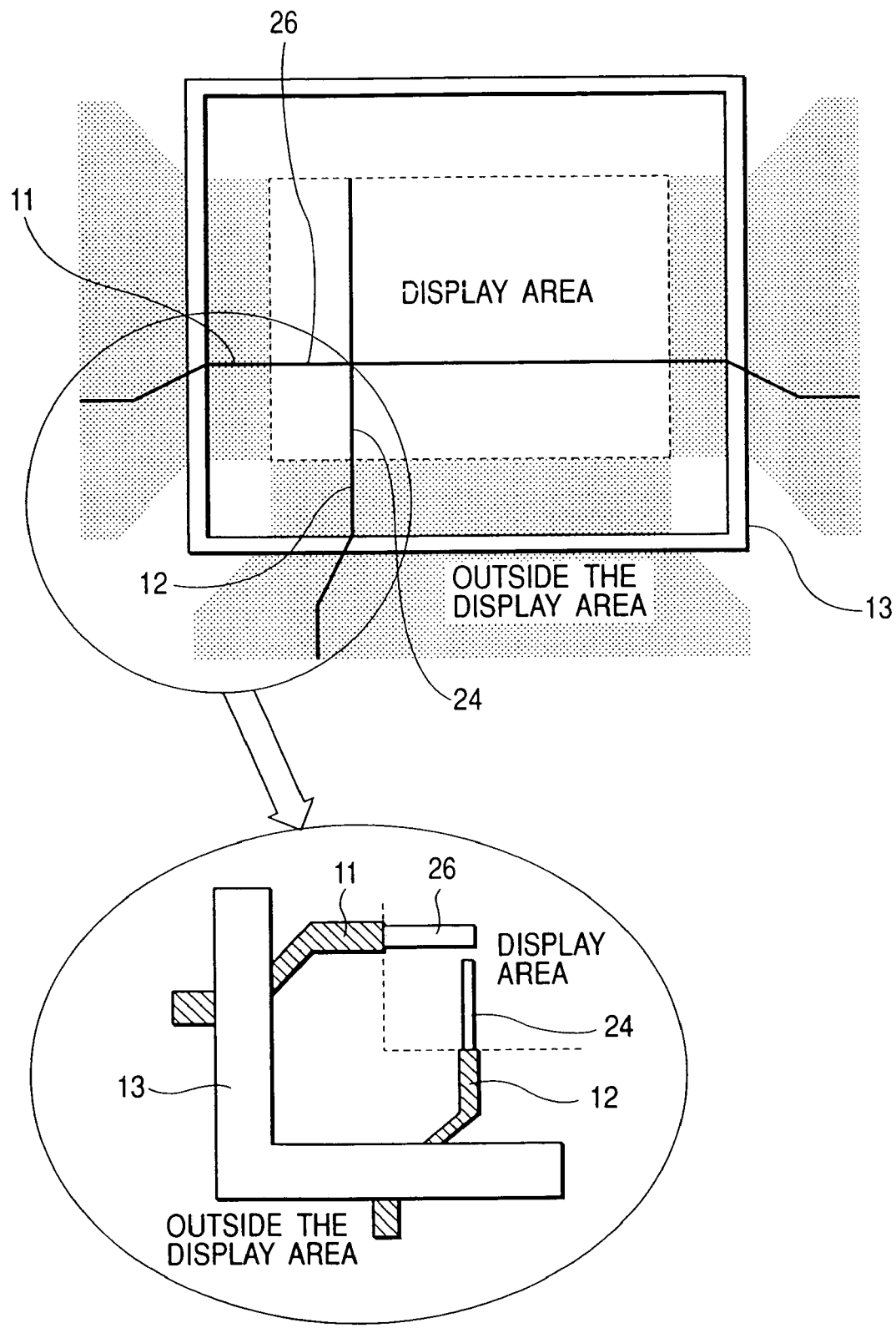
FIG. 1 is a schematic plan view for describing a wiring structure of an electron source plate according to the present invention.

The X and Y direction drawn out wirings 11 and 12 for connection to the external drive circuit are formed in a similar way as that of the above-described X direction wirings (upper wirings) 26 (See FIG. 1). It is to be noted that the wiring width of the drawn out wirings 11 and 12 are larger, and is 100 μm to 500 μm depending on the location.

As described above, according to the present embodiment, by forming the Y direction wirings 24 in the display area by photolithography using a photo paste and by forming both of the X and Y direction wirings outside the display area (drawn out wirings 11 and 12) by screen printing, the substrate having XY matrix wirings is formed where the Y direction wirings 24 in the display area have a cross section shape the average angle of which with the substrate is obtuse as illustrated in FIG. 18A while both of the X and Y direction wirings outside the display area (drawn out wirings 11 and 12) have a cross section shape the average angle of which with the substrate is acute as illustrated in FIG. 17A.

(Formation of Conductive Film)

Next, after the above-mentioned substrate is sufficiently cleaned, its surface is treated with a solution including a water repellent to make the surface hydrophobic. The purpose is to adequately spread on the device electrodes an aqueous solution to be applied later for forming the conductive film. Dimethyldiethoxysilane is used as the water repellent, and is sprayed onto the substrate and dried with hot air at 120° C.

After that, the conductive film 4 is formed between the device electrodes 2 and 3. This process is described with reference to the schematic views of FIGS. 7A to 7C. It is to be noted that, in order to compensate for variations in the plane of the respective device electrodes on the substrate 21, misalignment of the pattern is observed at several points on the substrate. By linearly approximating the amounts of misalignment among the observation points to complement the positions and applying a material for forming the conductive film, misalignment of all the pixels is eliminated and accurate application at corresponding positions is carried out.

Figure 7A:
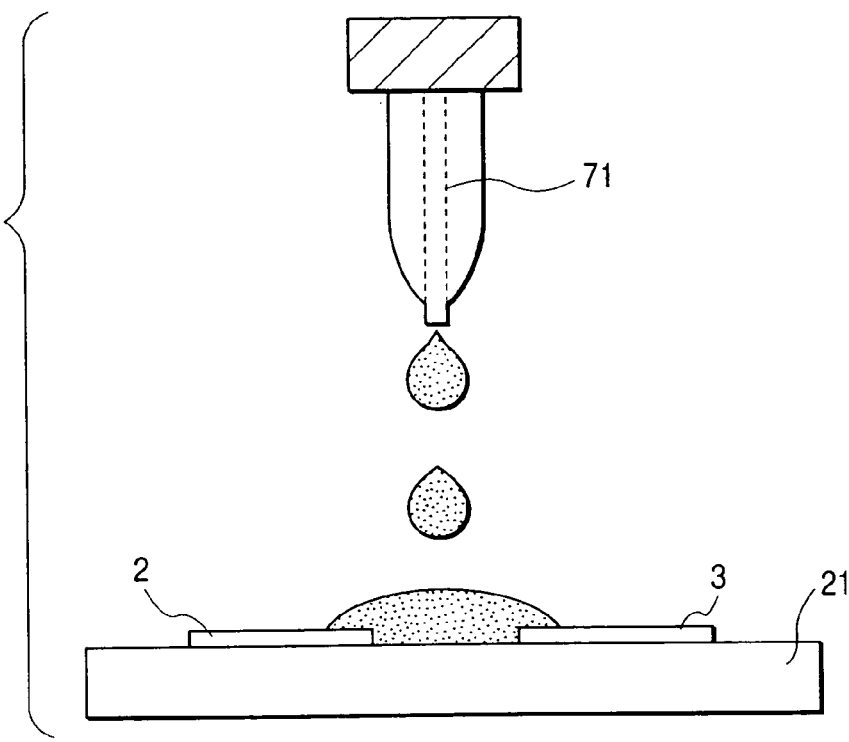
FIGS. 7A, 7B, and 7C are views for describing the manufacturing process of the electron source plate of FIG. 2.

In the present embodiment, for the purpose of obtaining a palladium film as the conductive film 4, first, 0.15 weight % of palladium-proline complex is dissolved in an aqueous solution having the water/isopropyl alcohol (IPA) ratio of 85:15 to obtain a solution containing organic palladium. A small amount of additive is added thereto. Drops of this solution are applied between the device electrodes using as a means 71 for applying drops an inkjet firing device utilizing a piezo actuator making an adjustment such that the dot diameter is 60 μm (FIG. 7A).

Figure 7B:
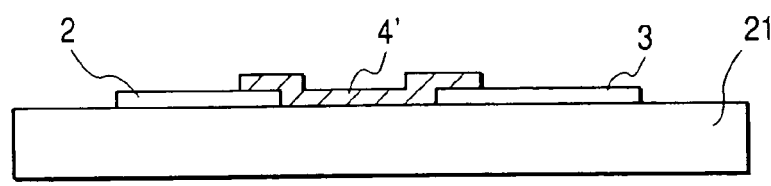

After that, the substrate is treated in the air to be heated and baked at 350° C. for ten minutes to form a conductive film 4' made of palladium oxide (PdO) (FIG. 7B). The obtained film has the dot diameter of about 60 μm, and the thickness of 10 nm at the maximum.

(Forming Process)

Figure 7C:
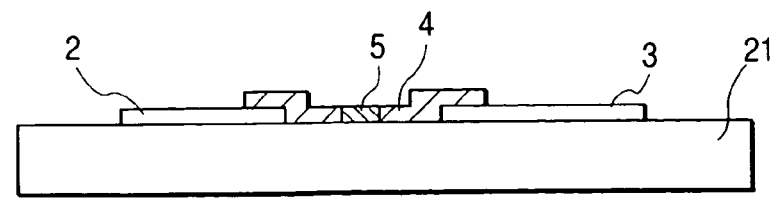

Next, in a process called forming, electric current is caused to flow through the conductive film 4' to form fissures therein and the electron-emitting region 5 is formed (FIG. 7C).

More specifically, a hood-like cover is put so as to cover the entire substrate except the drawn out wiring portions around the substrate 21 to form a vacuum space between the cover and the substrate 21. By applying voltage between the X and Y direction wirings 24 and 26 from the terminal portions of the drawn out wirings by an external power supply to pass electric current between the device electrodes 2 and 3, the conductive film 4' is locally broken, deformed, or altered to form an electron-emitting region 5 which has electrically high resistance. The hood-like cover and the substrate 21 form an airtight container by being in contact with each other through an O ring made of resin.

Here, by carrying out energization and heating in a vacuum atmosphere including a small amount of hydrogen gas, reduction reaction is accelerated by the hydrogen, and the conductive film 4' made of palladium oxide PdO is changed to the conductive film 4 made of palladium Pd.

During this change, due to contraction of the film caused by the reduction, fissures (gaps) are formed in a part of the film. The locations and the shapes of the generated fissures greatly depend on the evenness of the original film. In order to suppress variations in the characteristics among the multiple devices, it is more preferable than anything else that the above-mentioned fissures are formed in the middle portion of the conductive film 4 and are as linear as possible.

It is to be noted that, under predetermined voltage, electrons are emitted even from around the fissures formed by the forming process, but, under the present conditions, the efficiency of generation is still quite low.

Resistance value Rs of the obtained conductive film 4 is from $10^2$ to $10^7$ Ω.

In the present embodiment, a pulse waveform illustrated in FIG. 8B is used in the forming process, wherein T1 is 0.1 msec and T2 is 50 msec. The applied voltage starts from 0.1 V, and is incremented by about 0.1 V every five seconds. When the forming process by energization is to be ended is decided by the resistance value determined by measuring the electric current through the device when the pulse voltage is applied, and the forming is ended when the resistance is 1000 times or more as much as the resistance before the forming process.

(Activation Process)

Similarly to the case of the above-described forming, a hood-like cover is put so as to form a vacuum space between the inside of the cover and the substrate 21. By repeatedly applying pulse voltage between the device electrodes 2 and 3 through the X and Y direction wirings 24 and 26 from the external, an activation process is carried out. Then, gas including carbon atoms is introduced, and carbon or a carbon compound derived therefrom is deposited proximate to the fissures as a carbon film.

In the present embodiment, trinitrile is used as the carbon source and is introduced into the vacuum space through a slow leak valve, and $1.3 \times 10^{-4}$ Pa is maintained.

FIGS. 11A and 11B illustrate preferable examples of voltage application used in the activation process. The maximum voltage value to be applied is appropriately selected in the range of 10 to 20 V.

In FIG. 11A, T1 is a pulse width of a positive voltage waveform and a negative voltage waveform. T2 is a pulse interval. The absolute value of the positive voltage value and that of the negative voltage value are set to be equal to each other. In FIG. 11B, T1 is a pulse width of a positive voltage waveform and T1' is a pulse width of a negative voltage waveform, and T2 is a pulse interval, wherein T1>T1'. The absolute value of the positive voltage value and that of the negative voltage value are set to be equal to each other.

Here, voltage applied to the device electrode 3 is made positive. The positive direction of the device current If is from the device electrode 3 to the device electrode 2. After about sixty minutes when the emission current Ie is almost saturated, the energization is stopped, the slow leak valve is closed, and the activation process is ended. It is to be noted that, in the above-described forming and activation processes, the formation of the airtight container with the hood-like cover through the O ring is sufficiently satisfactory, and the vacuum atmosphere in the forming process and the activation atmosphere (carbon atmosphere) in the activation process are sufficiently maintained.

Through the above processes, the electron source plate formed by connecting the multiple electron-emitting devices to wirings in a matrix thereon can be formed.

(Characteristic Evaluation of Electron Source Plate)

Electron emission characteristics of the electron source plate having the above-described device configuration and formed by the above-described manufacturing method are measured using the apparatus as illustrated in FIG. 9. As a result, when the voltage applied between the device electrodes is 12 V, the emission current Ie is 0.6 µA on average and the obtained electron emission efficiency is 0.15% on average. The evenness among the devices is also excellent, and the variation in Ie among the devices is 5%, which is satisfactory.

Next, using the electron source plate in a passive matrix manufactured as described in the above, an image forming apparatus (display panel) as illustrated in FIG. 12 is manufactured. It is to be noted that FIG. 12 is partially cut away to reveal the inside.

In the present embodiment, the electron source plate 21, the support frame 86, and the face plate 82 are laminated via frit glass, and baking is carried out at 480° C. for thirty minutes to perform seal bonding, thereby obtaining the envelope 90.

It is to be noted that, by carrying out the entire series of processes in the vacuum chamber, the inside of the envelope 90 can be made vacuum from the beginning, and the processes can be simplified.

Figure 14:
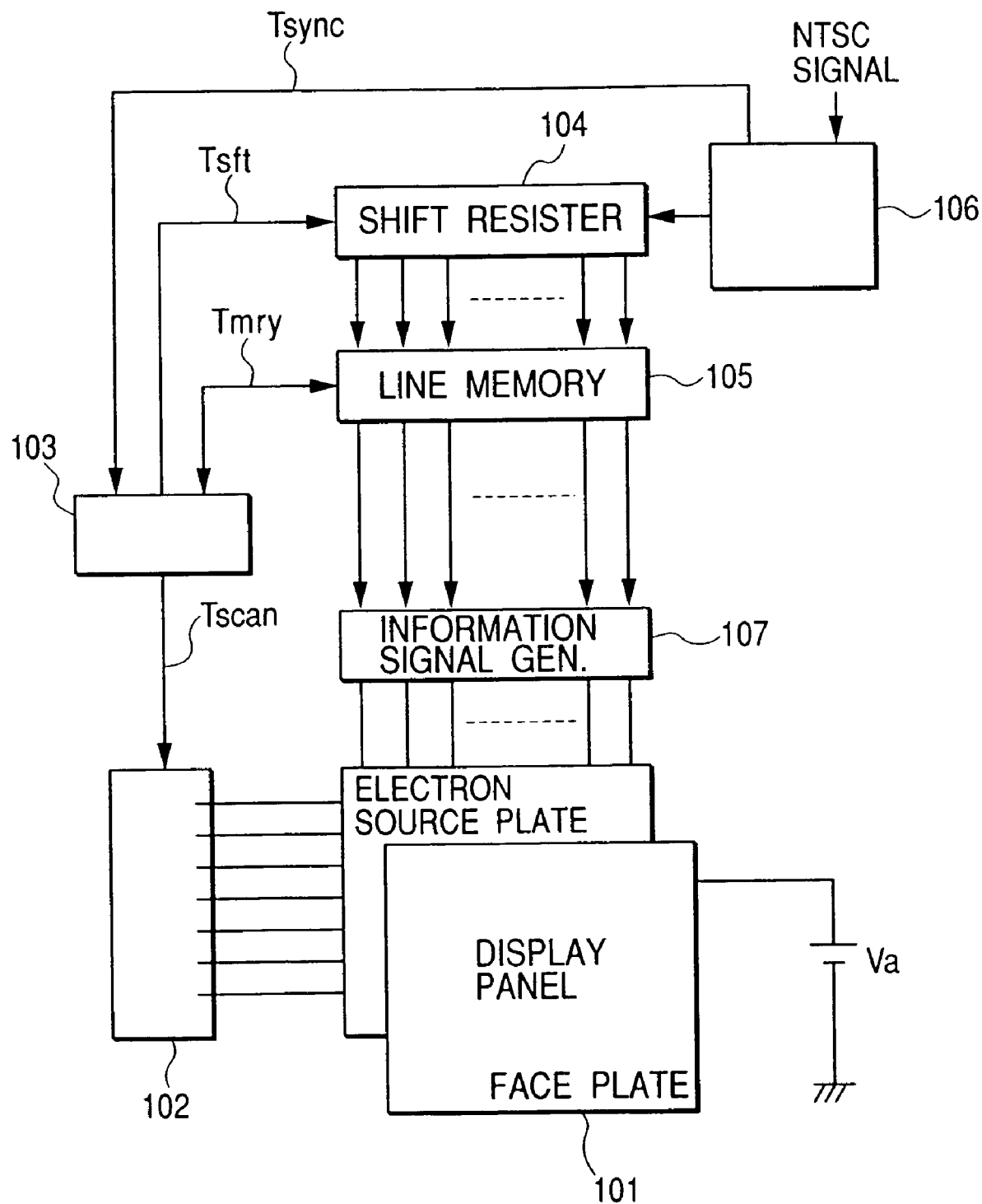
FIG. 14 is a drive circuit diagram of the image forming apparatus according to the present invention.

In this way, the display panel illustrated in FIG. 12 is formed, a drive circuit illustrated in FIG. 14 and comprising a scanning circuit, a control circuit, a modulation circuit, a direct current voltage source, and the like is connected thereto, and a panel-like image display device is manufactured.

In the image display device manufactured in the above way, electrons are emitted by applying predetermined voltage on a time division basis through the X and Y direction terminals to the respective electron-emitting devices, high voltage is applied to the metal back 85 as the anode electrode through a high voltage terminal Hv, and generated electron beams are accelerated to hit against the fluorescent film 84, to display an image.

In the present embodiment, since a sufficient height of the Y direction wirings 24 disposed substantially in parallel with the electron-emitting regions 5 formed as lines is secured and the trajectory of emitted electrons can be satisfactorily controlled, the light emission efficiency is high. Further, since the average angle between the cross section of both of the X and Y direction wirings (drawn out wirings 11 and 12) and the substrate outside the display area is made acute, both of the X and Y direction wirings are free from edge curls and side cracks outside the display area, and an image forming apparatus with high vacuum reliability is obtained.

EMBODIMENT 2

In the present embodiment, both of X and Y direction drawn out wirings outside a display area are formed simultaneously with forming Y direction wirings in the display area. Both of the X and Y direction drawn out wirings are further coated with acrylic resin and, simultaneously, baking is carried out. Except this, an electron source plate is formed in a similar way as in the case of Embodiment 1. Only the wiring formation part is described in the following.

(Formation of Y Direction Wiring)

The Y direction wirings (lower wirings) 24 are formed by photolithography using a photo paste material so as to be in contact with and so as to connect the device electrodes 3 of the device electrodes 2 and 3 in a pattern as lines. Ag photo paste ink DC-206 (manufactured by Dupont) is used as the material. After screen printing and drying the material, exposure and development are carried out in a predetermined pattern. After that, baking is carried out at the temperature of about 480° C. to form the Y direction wirings 24 (See FIG. 4). The Y direction wirings 24 have the thickness of about 15 µm and the wiring width of about 50 µm, respectively.

Further, simultaneously with the formation of the Y direction wirings, both of the X and Y direction drawn out wirings 11 and 12 illustrated in FIG. 1 are formed. The wiring width of the X and Y direction drawn out wirings 11 and 12 varies depending on the location, and is 60 µm to 300 µm. Here, after the patterning of the wirings, partial coating is carried out outside the display area using photosensitive acrylic resin, and baking is carried out simultaneously with the wiring formation.

(Formation of Insulating Layer)

In order to insulate the upper and lower wirings from each other, the insulating layer 25 is formed. The insulating layer 25 is formed beneath the X direction wirings (upper wirings) to be described later so as to cover the intersecting portions with the previously formed Y direction wirings (lower wirings) 24 and so as to allow electrical connection between the X direction wirings (upper wirings) and the device electrodes 2 with contact holes 27 provided at connecting portions corresponding to the respective devices (See FIG. 5).

More specifically, after photosensitive glass paste J1345 (manufactured by Dupont) the main component of which is PbO is applied by screen printing, exposure and development are carried out. This is repeated four times, and finally, baking at the temperature of about 480° C. is carried out. The insulating layer 25 has the thickness of about 30 µm as a whole and the width of 150 µm.

(Formation of X Direction Wiring)

After the Ag paste ink is applied on the previously formed insulating layer 25 by screen printing, it is dried. The same is repeated to carry out double application. After that, baking at the temperature of about 420° C. is carried out to form the X direction wirings (upper wirings) 26 (See FIG. 6). The X direction wirings 26 intersect the Y direction wirings 24 with the insulating layer 25 sandwiched therebetween, and are connected to the device electrodes 2 at the contact holes 27 provided in the insulating layer 25. The X direction wirings 26 have the thickness of about 15 µm and the wiring width of about 300 µm, respectively.

In the present embodiment, the pattern of the Y direction wirings 24 is formed in the display area and the pattern of both of the X and Y direction drawn out wirings 11 and 12 is formed outside the display area through exposure and development by photolithography using a photo paste, and after that, outside the display area, an overcoat layer (photosensitive acrylic resin) is formed on the wiring pattern, which layer disappears at a point higher than a temperature at which any organic component in the photo paste (Ag photo paste ink DC-206) disappears and lower than the softening point of any inorganic component in the photo paste (Ag photo paste ink DC-206). By baking the wiring pattern and the overcoat layer simultaneously, the substrate having XY matrix wirings is formed where the Y direction wirings 24 in the display area have a cross section shape the average angle of which with the substrate is obtuse as illustrated in FIG. 18A while both of the X and Y direction wirings outside the display area (drawn out wirings 11 and 12) have a cross section shape the average angle of which with the substrate is, as a whole, acute as illustrated in FIG. 17A.

In the electron source plate of the present embodiment, similarly to the case of Embodiment 1, improvement in light emission efficiency is secured, and at the same time, improvement in vacuum reliability of a process for forming devices of the electron source plate and of an image forming apparatus using the electron source plate can be materialized. In addition, the drawn out wiring portions connected to an external drive circuit can be made high-density, and the outer dimensions relating to the image display area can be made more compact.

EMBODIMENT 3

In the present embodiment, X and Y direction drawn out wirings outside a display area as first wirings are formed by photolithography using a photo paste. Further, as second wirings, second layer drawn out wirings are formed by screen printing using paste ink for printing which is not photolithographic paste on the X and Y direction drawn out wirings outside the display area (first wirings). Except this, an electron source plate is formed in a similar way as in the case of Embodiment 1. Only the wiring formation part is described in the following.

(Formation of Y Direction Wiring)

The Y direction wirings (lower wirings) 24 are formed by photolithography using a photo paste material so as to be in contact with and so as to connect the device electrodes 3 of the device electrodes 2 and 3 in a pattern as lines. Ag photo paste ink DC-206 (manufactured by Dupont) is used as the material. After screen printing and drying the material, exposure and development are carried out in a predetermined pattern. After that, baking is carried out at the temperature of about 480° C. to form the Y direction wirings 24 (See FIG. 4). The Y direction wirings 24 have the thickness of about 15 μm and the wiring width of about 50 μm, respectively.

Further, simultaneously with the formation of the Y direction wirings, the Y direction drawn out wiring 12 illustrated in FIG. 1 is formed. The wiring width of the Y direction drawn out wiring 12 varies depending on the location, and is equal to or less than 100 μm.

(Formation of Insulating Layer)

In order to insulate the upper and lower wirings from each other, the insulating layer 25 is formed. The insulating layer 25 is formed beneath the X direction wirings (upper wirings) to be described later so as to cover the intersecting portions with the previously formed Y direction wirings (lower wirings) 24 and so as to allow electrical connection between the X direction wirings (upper wirings) and the device electrodes 2 with contact holes 27 provided at connecting portions corresponding to the respective devices (See FIG. 5).

More specifically, after photosensitive glass paste J1345 (manufactured by Dupont) the main component of which is PbO is applied by screen printing, exposure and development are carried out. This is repeated four times, and finally, baking at the temperature of about 480° C. is carried out. The insulating layer 25 has the thickness of about 30 μm as a whole and the width of 150 μm.

(Formation of X Direction Wiring)

X direction drawn out wirings 11 outside the display area as illustrated in FIG. 1 are first formed by photolithography using a photo paste material. Ag photo paste ink DC-206 (manufactured by Dupont) is used as the material. After screen printing and drying the material, exposure and development are carried out in a predetermined pattern. After that, baking is carried out at the temperature of about 480° C.

Then, after the Ag paste ink is further applied on the previously formed insulating layer 25 and X direction drawn out wirings 11 by screen printing, it is dried. The same is repeated to carry out double application. After that, baking at the temperature of about 420° C. is carried out. Next, after the Ag paste ink is also applied on the Y direction drawn out wirings by screen printing, it is dried. The same is repeated to carry out double application. After that, baking at the temperature of about 420° C. is carried out. It is to be noted that X direction wirings 26 formed in this way intersect the Y direction wirings 24 with the insulating layer 25 sandwiched therebetween, and are connected to the device electrodes 22 at contact holes 27 provided in the insulating layer 25.

The X direction wirings 26 in the display area have the thickness of about 15 μm. The X direction drawn out wirings 11 outside the display area have the thickness of about 30 μm and the wiring width of 100 μm or less.

In the present embodiment, the substrate having XY matrix wirings is formed where the Y direction wirings 24 in the display area have a cross section shape the average angle of which with the substrate is obtuse as illustrated in FIG. 18A while both of the X and Y direction wirings outside the display area have a cross section shape the average angle of which with the substrate is acute as illustrated in FIG. 17A.

In the electron source plate of the present embodiment, similarly to the case of Embodiment 1, improvement in light emission efficiency is secured, and at the same time, airtightness with an O ring made of resin in forming and activation processes is sufficiently satisfactory.

Preferred embodiments of the present invention are described in the above. It is to be noted that the present invention is not limited to display devices using surface conduction electron-emitting devices, and the present invention is also applicable to display devices using various kinds of electron-emitting devices such as FE type devices and MIM type devices. Further, the present invention is not limited to an electron beam excitation type display device using electron-emitting devices, and the present invention is also applicable to display devices using an airtight container such as PDPs. For example, in the case of a PDP, the above-described embodiments may be applied to an address electrode and a drawn out portion disclosed in Japanese Patent Application Laid-Open No. 2001-189136 to form a back panel. Further, the above-described embodiments may also be applied to a display electrode and a drawn out portion to form a front panel. It is to be noted that, in a PDP, fit glass in a seal-bonding portion is understood to also serve as a frame member. With regard to the type of panel of a PDP, as disclosed in Japanese Patent Application Laid-Open No. 2001-189136, the present invention is not limited to a surface discharge type, and the present invention is also applicable to an opposing discharge type. With regard to a driving method, the present invention is applicable both to an AC type and to a DC type.

As described in the above, since, in a wiring substrate according to the present invention, a sufficient edge height of desired wirings in a display area is secured and cross section shapes of wirings are controlled in and outside the display area, a wiring substrate for a display device can be provided which decreases the wiring resistance, and at the same time, can materialize an airtight container free from edge curls of the wirings and side cracks in the substrate outside the display area (in a seal-bonding portion).

With regard to an image forming apparatus using such a wiring substrate as an electron source plate, an image forming apparatus having improved light emission efficiency and having high vacuum reliability can be materialized, and thus, a high definition image can be obtained with a higher-density pixel arrangement.

What is claimed is:

1. A manufacturing method for a wiring substrate for a display panel having a plurality of wiring electrodes thereon, with an airtight container being formed by disposing an opposing substrate through a frame member on the surface of the substrate having the wiring electrodes, and the airtight container having an image forming member therein, comprising:

forming wirings in an orthogonal projection area of the image forming member onto the wiring substrate by photolithography using a photo paste; and forming wirings in an area where the frame member is disposed by pattern printing using paste ink for printing, wherein an average angle between a cross section of at least one of the plurality of wiring electrodes and the wiring substrate in an orthogonal projection area of the image forming member onto the wiring substrate is obtuse, while an average angle between a cross section of the wirings and the wiring substrate in an area where the frame member is disposed is acute.

2. A manufacturing method for a wiring substrate for a display panel having a plurality of wiring electrodes thereon, an airtight container being formed by disposing an opposing substrate through a frame member on the surface of the substrate having the wiring electrodes, and the airtight container having an image forming member therein, comprising:

forming a wiring pattern in an orthogonal projection area of the image forming member onto the wiring substrate and in an area where the frame member is disposed by photolithography using a photo paste;

forming an overcoat layer which disappears at a point higher than a temperature at which an organic component of the photo paste disappears and lower than a softening point of an inorganic component of the photo paste on the wiring pattern in the area where the frame member is disposed; and baking simultaneously the wiring pattern and the overcoat layer, wherein an average angle between a cross section of at least one of the plurality of wiring electrodes and the wiring substrate in an orthogonal projection area of the image forming member onto the wiring substrate is obtuse, while an average angle between a cross section of the wiring pattern and the wiring substrate in an area where the frame member is disposed is acute.

3. A manufacturing method for a wiring substrate for a display panel having a plurality of wiring electrodes thereon, with an airtight container being formed by disposing an opposing substrate through a frame member on the surface of the substrate having the wiring electrodes, and the airtight container having an image forming member therein, comprising:

forming first wirings in an orthogonal projection area of the image forming member onto the wiring substrate and in an area where the frame member is disposed by photolithography using a photo paste; and forming second wirings on the first wirings in the area where the frame member is disposed by pattern printing using paste ink for printing, wherein an average angle between a cross section of at least one of the plurality of wiring electrodes and the wiring substrate in an orthogonal projection area of the image forming member onto the wiring substrate is obtuse, while an average angle between a cross section of the wirings and the wiring substrate in an area where the frame member is disposed is acute.

* * * * *

UNITED STATES PATENT AND TRADEMARK OFFICE
CERTIFICATE OF CORRECTION

PATENT NO. : 7,264,842 B2  
APPLICATION NO. : 10/886632  
DATED : September 4, 2007  
INVENTOR(S) : Yasuyuki Watanabe et al.

It is certified that error appears in the above-identified patent and that said Letters Patent is hereby corrected as shown below:

<u>COLUMN 19</u>:

Line 5, "fit" should read --frit--.

Signed and Sealed this

Third Day of February, 2009

JOHN DOLL  
*Acting Director of the United States Patent and Trademark Office*